(12) United States Patent
Johnson et al.

(10) Patent No.: US 8,503,215 B2
(45) Date of Patent: Aug. 6, 2013

(54) VERTICALLY STACKED FIELD PROGRAMMABLE NONVOLATILE MEMORY AND METHOD OF FABRICATION

(75) Inventors: Mark G. Johnson, Los Altos, CA (US); Thomas H. Lee, Cupertino, CA (US); Vivek Subramanian, Menlo Park, CA (US); Paul Michael Farmwald, Portola Valley, CA (US); James M. Cleeves, Redwood City, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/526,671

(22) Filed: Jun. 19, 2012

(65) Prior Publication Data

US 2012/0250396 A1 Oct. 4, 2012

Related U.S. Application Data

(60) Continuation of application No. 12/899,634, filed on Oct. 7, 2010, now Pat. No. 8,208,282, which is a continuation of application No. 11/925,723, filed on Oct. 26, 2007, now Pat. No. 7,816,189, which is a continuation of application No. 11/355,214, filed on Feb. 14, 2006, now Pat. No. 7,319,053, which is a continuation of application No. 09/939,498, filed on Aug. 24, 2001, now Pat. No. 7,157,314, which is a continuation of application No. 09/714,440, filed on Nov. 15, 2000, now Pat. No. 6,351,406, which is a continuation of application No. 09/469,658, filed on Dec. 22, 1999, now Pat. No. 6,185,122, which is a division of application No. 09/192,883, filed on Nov. 16, 1998, now Pat. No. 6,034,882.

(51) Int. Cl.
*G11C 11/36* (2006.01)

(52) U.S. Cl.
USPC ............ 365/115; 365/105; 365/100; 365/148

(58) Field of Classification Search
CPC ...... G11C 11/36; G11C 17/16; G11C 2213/71; G11C 11/5692; G11C 13/003; G11C 17/14; G11C 17/165; G11C 2213/33; G11C 2213/76
USPC .................................. 365/100, 148, 105, 115
See application file for complete search history.

(56) References Cited

U.S. PATENT DOCUMENTS 3,134,963 A 5/1964 Henle et al.
3,414,892 A 12/1968 McCormack et al.

(Continued)

FOREIGN PATENT DOCUMENTS

CN 85108221 5/1987
EP 0 073 486 3/1983

(Continued)

OTHER PUBLICATIONS

Douglas, John H. "The Route to 3-D Chips" High Technology, Sep. 1983, vol. 3, No. 9, pp. 55-59.

(Continued)

*Primary Examiner* — Thong Q Le
(74) *Attorney, Agent, or Firm* — Dugan & Dugan, PC

(57) ABSTRACT

A memory cell is provided that includes a steering element, and a non-volatile state change element coupled in series with the steering element. The steering element and state change element are disposed in a vertically-oriented pillar. Other aspects are also provided.

20 Claims, 22 Drawing Sheets

U.S. PATENT DOCUMENTS

| | | |
|---|---|---|
| 3,432,827 A | 3/1969 | Sarno |
| 3,452,334 A | 6/1969 | Voegeli |
| 3,576,549 A | 4/1971 | Hess et al. |
| 3,582,908 A | 6/1971 | Koo |
| 3,634,929 A | 1/1972 | Yoshida et al. |
| 3,671,948 A | 6/1972 | Cassen et al. |
| 3,696,349 A | 10/1972 | Kaske et al. |
| 3,717,852 A | 2/1973 | Abbas et al. |
| 3,728,695 A | 4/1973 | Frohman-Bentchkowsky |
| 3,787,822 A | 1/1974 | Rioult |
| 3,863,231 A | 1/1975 | Taylor |
| 3,913,224 A | 10/1975 | Preissinger et al. |
| 3,990,098 A | 11/1976 | Mastrangelo |
| 4,146,902 A | 3/1979 | Tanimoto et al. |
| 4,203,123 A | 5/1980 | Shanks |
| 4,203,158 A | 5/1980 | Frohman-Bentchkowsky et al. |
| 4,229,757 A | 10/1980 | Moussie |
| 4,272,880 A | 6/1981 | Pashley |
| 4,281,397 A | 7/1981 | Neal et al. |
| 4,338,622 A | 7/1982 | Feth et al. |
| 4,417,325 A | 11/1983 | Harari et al. |
| 4,419,741 A | 12/1983 | Stewart et al. |
| 4,420,766 A | 12/1983 | Kasten |
| 4,425,379 A | 1/1984 | Vora et al. |
| 4,442,507 A | 4/1984 | Roesner |
| 4,489,478 A | 12/1984 | Sakurai |
| 4,494,135 A | 1/1985 | Moussie |
| 4,498,226 A | 2/1985 | Inoue et al. |
| 4,499,557 A | 2/1985 | Holmberg et al. |
| 4,500,905 A | 2/1985 | Shibata |
| 4,507,757 A | 3/1985 | McElroy |
| 4,535,424 A | 8/1985 | Reid |
| 4,543,594 A | 9/1985 | Mohsen et al. |
| 4,569,121 A | 2/1986 | Lim et al. |
| 4,630,096 A | 12/1986 | Drye et al. |
| 4,646,266 A | 2/1987 | Ovshinsky et al. |
| 4,672,577 A | 6/1987 | Hirose et al. |
| 4,677,742 A | 7/1987 | Johnson |
| 4,710,798 A | 12/1987 | Marcantonio |
| 4,796,234 A | 1/1989 | Itoh et al. |
| 4,820,657 A | 4/1989 | Hughes et al. |
| 4,823,181 A | 4/1989 | Mohsen et al. |
| 4,845,669 A | 7/1989 | Chappell et al. |
| 4,855,903 A | 8/1989 | Carleton et al. |
| 4,855,953 A | 8/1989 | Tsukamoto et al. |
| 4,876,220 A | 10/1989 | Mohsen et al. |
| 4,881,114 A | 11/1989 | Mohsen et al. |
| 4,899,205 A | 2/1990 | Hamdy et al. |
| 4,922,319 A | 5/1990 | Fukushima |
| 4,943,538 A | 7/1990 | Mohsen et al. |
| 5,001,539 A | 3/1991 | Inoue et al. |
| 5,070,383 A | 12/1991 | Sinar et al. |
| 5,070,384 A | 12/1991 | McCollum et al. |
| 5,089,862 A | 2/1992 | Warner, Jr. et al. |
| 5,103,422 A | 4/1992 | Tokita et al. |
| 5,126,290 A | 6/1992 | Lowrey et al. |
| 5,160,987 A | 11/1992 | Pricer et al. |
| 5,191,405 A | 3/1993 | Tomita et al. |
| 5,197,025 A | 3/1993 | Schwee et al. |
| 5,202,754 A | 4/1993 | Bertin et al. |
| 5,233,206 A | 8/1993 | Lee et al. |
| 5,242,851 A | 9/1993 | Choi |
| 5,266,912 A | 11/1993 | Kledzik |
| 5,269,852 A | 12/1993 | Nishida |
| 5,283,468 A | 2/1994 | Kondo et al. |
| 5,287,000 A | 2/1994 | Takahashi et al. |
| 5,289,410 A | 2/1994 | Katti et al. |
| 5,296,716 A | 3/1994 | Ovshinsky et al. |
| 5,306,935 A | 4/1994 | Esquivel et al. |
| 5,311,039 A | 5/1994 | Kimura et al. |
| 5,334,880 A | 8/1994 | Abadeer et al. |
| 5,391,518 A | 2/1995 | Bhushan |
| 5,391,917 A | 2/1995 | Gilmour et al. |
| 5,398,200 A | 3/1995 | Mazure et al. |
| 5,422,435 A | 6/1995 | Takiar et al. |
| 5,426,566 A | 6/1995 | Beilstein, Jr. et al. |
| 5,427,979 A | 6/1995 | Chang |
| 5,429,968 A | 7/1995 | Koyama |
| 5,434,745 A | 7/1995 | Shokrgozar et al. |
| 5,436,861 A | 7/1995 | Katti et al. |
| 5,441,907 A | 8/1995 | Sung et al. |
| 5,453,952 A | 9/1995 | Okudaira et al. |
| 5,455,445 A | 10/1995 | Kurtz et al. |
| 5,463,244 A | 10/1995 | De Araujo et al. |
| 5,467,305 A | 11/1995 | Bertin et al. |
| 5,468,997 A | 11/1995 | Imai et al. |
| 5,471,090 A | 11/1995 | Deutsch et al. |
| 5,481,133 A | 1/1996 | Hsu |
| 5,495,398 A | 2/1996 | Takiar et al. |
| 5,502,289 A | 3/1996 | Takiar et al. |
| 5,508,971 A | 4/1996 | Cernea et al. |
| 5,523,622 A | 6/1996 | Harada et al. |
| 5,523,628 A | 6/1996 | Williams et al. |
| 5,535,156 A | 7/1996 | Levy et al. |
| 5,536,968 A | 7/1996 | Crafts et al. |
| 5,539,839 A | 7/1996 | Bellegarda et al. |
| 5,539,893 A | 7/1996 | Thompson et al. |
| 5,552,963 A | 9/1996 | Burns |
| 5,561,315 A | 10/1996 | Van Dort |
| 5,561,622 A | 10/1996 | Bertin et al. |
| 5,578,836 A | 11/1996 | Husher et al. |
| 5,581,111 A | 12/1996 | Chen |
| 5,581,498 A | 12/1996 | Ludwig et al. |
| 5,585,675 A | 12/1996 | Knopf |
| 5,596,532 A | 1/1997 | Cernea et al. |
| 5,602,987 A | 2/1997 | Harari et al. |
| 5,612,570 A | 3/1997 | Eide et al. |
| 5,625,220 A | 4/1997 | Liu et al. |
| 5,640,343 A | 6/1997 | Gallagher et al. |
| 5,654,220 A | 8/1997 | Leedy |
| 5,666,304 A | 9/1997 | Hikawa et al. |
| 5,675,547 A | 10/1997 | Koga |
| 5,682,059 A | 10/1997 | Yoshii et al. |
| 5,686,341 A | 11/1997 | Roesner |
| 5,691,933 A | 11/1997 | Takenaka |
| 5,693,552 A | 12/1997 | Hsu |
| 5,693,556 A | 12/1997 | Cleeves |
| 5,696,031 A | 12/1997 | Wark |
| 5,703,747 A | 12/1997 | Voldman et al. |
| 5,714,795 A | 2/1998 | Ohmi et al. |
| 5,726,484 A | 3/1998 | Hart et al. |
| 5,737,259 A | 4/1998 | Chang |
| 5,744,394 A | 4/1998 | Iguchi et al. |
| 5,745,407 A | 4/1998 | Levy et al. |
| 5,751,012 A | 5/1998 | Wolstenholme et al. |
| 5,751,629 A | 5/1998 | Nova et al. |
| 5,763,299 A | 6/1998 | McCollum et al. |
| 5,776,810 A | 7/1998 | Guterman et al. |
| 5,780,346 A | 7/1998 | Arghavani et al. |
| 5,780,925 A | 7/1998 | Cipolla et al. |
| 5,781,031 A | 7/1998 | Bertin et al. |
| 5,793,697 A | 8/1998 | Scheuerlein |
| 5,801,437 A | 9/1998 | Burns |
| 5,818,748 A | 10/1998 | Bertin et al. |
| 5,831,325 A | 11/1998 | Zhang |
| 5,835,396 A | 11/1998 | Zhang |
| 5,838,530 A | 11/1998 | Zhang |
| 5,854,534 A | 12/1998 | Beilin et al. |
| 5,866,938 A | 2/1999 | Takagi et al. |
| 5,883,409 A | 3/1999 | Guterman et al. |
| 5,897,354 A | 4/1999 | Kachelmeier |
| 5,903,059 A | 5/1999 | Bertin et al. |
| 5,915,167 A | 6/1999 | Leedy |
| 5,929,478 A | 7/1999 | Parris et al. |
| 5,937,318 A | 8/1999 | Warner, Jr. et al. |
| 5,952,671 A | 9/1999 | Reinberg et al. |
| 5,960,539 A | 10/1999 | Burns |
| 5,969,380 A | 10/1999 | Seyyedy |
| 5,969,383 A | 10/1999 | Chang et al. |
| 5,970,372 A | 10/1999 | Hart et al. |
| 5,976,953 A | 11/1999 | Zavracky et al. |
| 5,978,258 A | 11/1999 | Manning |
| 5,985,693 A | 11/1999 | Leedy |
| 5,991,225 A | 11/1999 | Forbes et al. |
| 5,994,172 A | 11/1999 | Ohtani et al. |
| 6,021,065 A | 2/2000 | Daughton et al. |
| 6,028,786 A * | 2/2000 | Nishimura .................... 365/173 |

| | | |
|---|---|---|
| 6,034,882 A | 3/2000 | Johnson et al. |
| 6,049,123 A | 4/2000 | Burns |
| 6,051,851 A | 4/2000 | Ohmi et al. |
| 6,055,180 A | 4/2000 | Gudesen et al. |
| 6,057,598 A | 5/2000 | Payne et al. |
| 6,072,234 A | 6/2000 | Camien et al. |
| 6,087,722 A | 7/2000 | Lee et al. |
| 6,111,302 A | 8/2000 | Zhang et al. |
| 6,124,154 A | 9/2000 | Miyasaka |
| 6,133,640 A | 10/2000 | Leedy |
| 6,140,676 A | 10/2000 | Lancaster |
| 6,150,705 A | 11/2000 | Chen |
| 6,160,276 A | 12/2000 | Mohsen |
| 6,185,122 B1 | 2/2001 | Johnson et al. |
| 6,197,641 B1 | 3/2001 | Hergenrother et al. |
| 6,208,545 B1 | 3/2001 | Leedy |
| 6,237,064 B1 | 5/2001 | Kumar et al. |
| 6,281,042 B1 | 8/2001 | Ahn et al. |
| 6,291,836 B1 | 9/2001 | Kramer et al. |
| 6,291,858 B1 | 9/2001 | Ma et al. |
| 6,307,257 B1 | 10/2001 | Huang et al. |
| 6,314,013 B1 | 11/2001 | Ahn et al. |
| 6,322,903 B1 | 11/2001 | Siniaguine et al. |
| 6,323,536 B1 | 11/2001 | Cutter et al. |
| 6,324,093 B1 | 11/2001 | Perner et al. |
| 6,337,521 B1 | 1/2002 | Masuda |
| 6,351,028 B1 | 2/2002 | Akram |
| 6,351,406 B1 | 2/2002 | Johnson et al. |
| 6,353,265 B1 | 3/2002 | Michii |
| 6,355,501 B1 | 3/2002 | Fung et al. |
| 6,385,074 B1 | 5/2002 | Johnson et al. |
| 6,420,215 B1 | 7/2002 | Knall et al. |
| 6,436,818 B1 | 8/2002 | Hu et al. |
| 6,444,507 B1 | 9/2002 | Miyasaka |
| 6,483,736 B2 | 11/2002 | Johnson et al. |
| 6,486,065 B2 | 11/2002 | Vyvoda et al. |
| 6,515,888 B2 | 2/2003 | Johnson et al. |
| 6,525,949 B1 | 2/2003 | Johnson |
| 6,525,953 B1 | 2/2003 | Johnson |
| 6,541,312 B2 | 4/2003 | Vyvoda et al. |
| 6,624,525 B2 | 9/2003 | Anezaki et al. |
| 6,631,085 B2 | 10/2003 | Kleveland et al. |
| 6,645,870 B2 | 11/2003 | Negishi et al. |
| 6,653,712 B2 | 11/2003 | Knall et al. |
| 6,653,733 B1 | 11/2003 | Gonzalez et al. |
| 6,664,639 B2 | 12/2003 | Cleeves |
| 6,689,644 B2 | 2/2004 | Johnson |
| 6,703,652 B2 | 3/2004 | Van Brocklin et al. |
| 6,704,235 B2 | 3/2004 | Knall et al. |
| 6,709,945 B2 | 3/2004 | McClure |
| 6,768,661 B2 | 7/2004 | Vyvoda et al. |
| 6,777,773 B2 | 8/2004 | Knall |
| 6,780,683 B2 | 8/2004 | Johnson et al. |
| 6,780,711 B2 | 8/2004 | Johnson et al. |
| 6,853,049 B2 | 2/2005 | Herner |
| 6,952,043 B2 | 10/2005 | Vyvoda et al. |
| 6,956,278 B2 | 10/2005 | Herner |
| 7,157,314 B2 | 1/2007 | Subramanian et al. |
| 7,160,761 B2 | 1/2007 | Cleeves et al. |
| 7,190,602 B2 | 3/2007 | Johnson et al. |
| 7,265,000 B2 | 9/2007 | Subramanian et al. |
| 7,283,403 B2 | 10/2007 | Johnson |
| 7,319,053 B2 | 1/2008 | Subramanian et al. |
| 7,488,625 B2 | 2/2009 | Knall |
| 7,511,352 B2 | 3/2009 | Vyvoda |
| 2001/0033030 A1 | 10/2001 | Leedy |
| 2001/0054759 A1 | 12/2001 | Nishiura |
| 2002/0024146 A1 | 2/2002 | Furusawa |
| 2002/0027257 A1 | 3/2002 | Akram |
| 2002/0030262 A1 | 3/2002 | Akram |
| 2002/0030263 A1 | 3/2002 | Akram |
| 2002/0100943 A1 | 8/2002 | Ogata et al. |
| 2003/0026157 A1 | 2/2003 | Knali et al. |
| 2003/0062594 A1 | 4/2003 | Chen |
| 2004/0016991 A1 | 1/2004 | Herner et al. |
| 2004/0089917 A1 | 5/2004 | Knall |
| 2004/0108573 A1 | 6/2004 | Herner |
| 2008/0119027 A1 | 5/2008 | Subramanian et al. |
| 2011/0019467 A1 | 1/2011 | Johnson |

FOREIGN PATENT DOCUMENTS

| | | |
|---|---|---|
| EP | 0 176 078 | 4/1986 |
| EP | 0 387 834 | 9/1990 |
| EP | 0 395 886 | 11/1990 |
| EP | 0 516 866 | 12/1992 |
| EP | 0 606 653 | 7/1994 |
| EP | 0 644 548 | 3/1995 |
| EP | 0 666 593 | 8/1995 |
| EP | 0 800 137 | 10/1997 |
| JP | 60-22352 | 2/1985 |
| JP | 61222216 | 10/1986 |
| JP | 63-52463 | 3/1988 |
| WO | WO 94/26083 | 11/1994 |
| WO | WO 99/14763 | 3/1999 |
| WO | WO 00/30118 | 5/2000 |

OTHER PUBLICATIONS

Frohman-Bentchkowsky, "A Fully Decoded 2048-Bit Electrically Programmable FAMOS Read-Only Memory" IEEE Journal of Solid-State Circuits, vol. sc-6, No. 5, Oct. 1971, pp. 301-306.

Sato, Noriaki et al., "A New Programmable Cell Utilizing Insulator Breakdown"; International Electronics Devices Meeting, 1985 IC Development Division, Fujitsu Limited Nakahara-ku, Kawasaki 211, Japan; pp. 639-642.

Kawashima et al., "A Charge-Transfer Amplifier and an Encoded-Bus Architecture for Low-Power SRAM's", IEEE Journal of Solid-State Circuits, 33, No. 5, 793-799 (1998).

Cappelleti et al., "Flash Memories", Kluwer Academic Publishers, Table of Contents, pp. 47, pp. 308 (1999).

Akasaka, Yoichi, "Three-Dimensional Integrated Circuit: Technology and Application Prospect," Microelectronics Journal, vol. 20 No. 1-2, 1989, pp. 105-111.

Akasaka, Yoichi, "Three-Dimensional IC Trends," Proceedings of the IEEE, vol. 74, No. 12, Dec. 1986, pp. 1703-1714.

Bertin, Claude L., "Evaluation of a Three-Dimensional Memory Cube System," IEEE Transactions on Components, Hybrids, and Manufacturing Technology, vol. 16, No. 8, Dec. 1993, 1006-1011.

Camperi-Ginestet, C., "Vertical Electrical Interconnection of Compound Semiconductor Thin-Film Devices to Underlying Silicon Circuitry," IEEE Photonics Technology Letters, vol. 4, No. 9, Sep. 1992, pp. 1003-1006.

Hayashi, Y., "A New Three Dimensional IC Fabrication Technology, Stacking Thin Film Dual CMOS Layers," IEDM 1991, pp. 657-660.

Hayasky, Fumihiko, "A Self-Aligned Split-Gate Flash EEPROM Cell with 3-D Pillar Structure" 1999 Symposium on VLSI Technology Digest of Technical Papers, pp. 87-88.

"3-D Chip-on-Chip Stacking," Industry News, Semiconductor International, Dec. 1991.

Inoue, Y., "A Three-Dimensional Static RAM," IEEE Electron Device Letters, vol. Edl.-7, No. 5, May 1986, pp. 327-329.

Jokerst, N. M., "Manufacturable Multi-Material Integration Compound Semiconductor," SPIE—The International Society for Optical Engineering, vol. 2524, Jul. 11-12, 1995, pp. 152-163.

Kurokawa, Takakazu, "3-D VLSI Technology in Japan and an Example: A Syndrome Decoder for Double Error Correction," Future Generations Computer Systems 4, No. 2, Sep. 1988, pp. 145-155.

Lay, Richard W., "TRW Develops Wireless Multiboard Interconnect System," Electronic Engineering Times, Nov. 5, 1984.

Maliniak, David, "Memory-Chip Stacks Send Density Skyward," Electronic Design 42, No. 17, Aug. 22, 1994, pp. 69-75.

Pein, Howard, et al., "Performance of the 3-D PENCIL Flash EPROM Cell and Memory Array," IEEE Transactions on Electron Devices, vol. 42, No. 11, Nov. 1995, pp. 1982-1991.

Reber, M., et al., "Benefits of Vertically Stacked Integrated Circuits for Sequential Logic," IEEE 1996, pp. 121-124.

Sakamoto, Koji, "Architecture of Three Dimensional Devices," Bulletin of the Electrotechnical Laboratory, vol. 51, No. 1, 1987, pp. 16-29.

Schlaeppi, H.P., "Microsecond Core Memories Using Multiple Coincidence," 1960 International Solid-State Circuits Conference, Digest of Technical Papers, Feb. 11, 1960, pp. 54-55.

Schlaeppi, H.P., "Microsecond Core Memories Using Multiple Coincidence," IRE Transactions on Electronic Computers, Jun. 1960, pp. 192-198.

Stacked Memory Modules, IBM Technical Disclosure Bulletin, May 1995, pp. 433-434.

Stern, Jon M., "Design and Evaluation of an Epoxy Three-Dimensional Multichip Module," IEEE Transactions on Components, Packaging, and Manufacturing Technology—Part B, vol. 19, No. 1, Feb. 1996, pp. 188-194.

Terrill, Rob, "3D Packaging Technology Overview and Mass Memory Applications," IEEE 1996, pp. 347-355.

Thakur, Shashidhar, "An Optimal Layer Assignment Algorithm for Minimizing Crosstalk for Three Layer VHV Channel Routing," IEEE 1995, pp. 207-210.

Watanabe, H., "Stacked Capacitor Cells for High-Density Dynamic RAMs," IEDM 1988, pp. 600-603.

Yamazaki, K., "Fabrication Technologies for Dual 4-KBIT stacked SRAM," IEDM 1986, pp. 435-438.

"Multilayered Josephson Junction Logic and Memory Devices," Lomatch, S; Rippert, E.D.; Ketterson, J.B., Proceedings of the SPIE—The International Society for Optical Engineering vol. 2157 p. 332-343, Jan. 1994.

"Advanced Cell Structures for Dynamic RAMs," Lu, N.C.C.: IEEE Circuits and Devices Magazine, vol. 5 No. 1 p. 27-36 Jan. 1989.

"Wide Application of Low-Cost Associative Processing Seen," Electronic Engineering Times, p. 43, Aug. 26, 1996.

"Interconnects & Packaging," Electronic Engineering Times, p. 43, Jun. 24, 1996.

"Closing in on Gigabit DRAMs," Electronic Engineering Times, p. 035, Nov. 27, 1995.

"Module Pact Pairs Cubic Memory with VisionTek," Semiconductor Industry & Business Survey, v17, n15, p. N/A Oct. 23, 1995.

"Layers of BST Materials Push Toward 1Gbit DRAM," Electronics Times, p. 10, Oct. 19, 1995.

"Technologies Will Pursue Higher DRAM Densities," Electronic News (1991), p. 12 Dec. 5, 1994.

"Looking for Diverse Storage," Electronic Engineering Times, p. 44 Oct. 31, 1994.

"Special Report: Memory Market Startups Cubic Memory: 3D Space Savers," Semiconductor Industry & Business Survey, v16, n13, p. N/A Sep. 12, 1994.

"Technique Boosts 3D Memory Density," Electronic Engineering Times p. 16 Aug. 29, 1994.

"Memory Packs Poised for 3D Use," Electronic Engineering Times p. 82 Dec. 7, 1992.

"MCMs Hit the Road," Electronic Engineering Times p. 45 Jun. 15, 1992.

"IEDM Ponders the "Gigachip" Era," Electronic Engineering Times, p. 33 Jan. 20, 1992.

"Tech Watch: 1-Gbit DRAM in Sight," Electronic World News, p. 20 Dec. 16, 1991.

"MCMs Meld into Systems," Electronic Engineering Times p. 35 Jul. 22, 1991.

"Systems EEs see Future in 3D," Electronic Engineering Times p. 37 Sep. 24, 1990.

Saeki et al., "A 2.5-ns Clock Access, 250-MHz, 256-Mb SDRAM with Synchronous Mirror Delay," IEEE Journal of Solid-State Circuits, vol. 31, No. 11, Nov. 1996, pp. 1656-1668.

Supplementary European Search Report of European Patent Application No. EP 99-92 1564 issued on Apr. 4, 2007.

International Search Report of International Application No. PCT/US99/09471 dated Jul. 19, 1999.

First Office Action of Chinese Patent Application No. 200510076065.5 issued on Jun. 29, 2007.

Second Office Action of Chinese Patent Application No. 200510076065.5 issued on Jun. 27, 2008.

First Office Action of Chinese Patent Application No. 99815543.8 issued on Jan. 31, 2003.

Second Office Action of Chinese Patent Application No. 99815543.8 issued on Sep. 26, 2003.

Third Office Action of Chinese Patent Application No. 99815543.8 issued on Jul. 9, 2004.

Office Action of U.S. Appl. No. 11/925,723 mailed Jan. 13, 2009.

Apr. 13, 2009 Reply to Jan. 13, 2009 Office Action of U.S. Appl. No. 11/925,723.

Final Office Action of U.S. Appl. No. 11/925,723 mailed Aug. 6, 2009.

C. de Graaff, et al. "A Novel High-Density Low-Cost Diode Programmable Read Only Memory" IEDM 96 (1996), pp. 189-192.

Chiang, Steve et al., "Antifuse Structure Comparison for Field Programmable Gate Arrays", IEDM 92-611 (Apr. 1992), pp. 24.6.1-24.6.4.

Hamdy, Esmat et al., "Dielectric Based Anitfuse for Logic and Memory ICs", IEDM 88 (1998), pp. 786-789.

Herner, S. Brad et al., "Polycrystalline silicon/CoSi2 Schottky diode with integrated SiO2 antifuse: a nonvolatile memory cell", Applied Physics Letters, vol. 82, No. 23, (Jun. 9, 2003), pp. 4163-4165.

Konakova, R.V. et al., "Ohmic Contacts for Microwave Diodes", Proc. 22nd International Conference on Microelectronics (MIEL 2000), vol. 2, NIS, Serbia, May 14-17, 2000 (Jan. 1999) pp. 477-480.

Shih, Chih-Ching et al., "Characterization and Modeling of a Highly Reliable Metal-to-Metal Antifuse for High-Performance and High-Density Field Programmable Gate Arrays", 1997 IEEE (Sep. 1997), pp. 25-33.

Wang, Shoue-Jen et al., "High-Performance Metal/Silicide Antifuse", IEEE Electron Device Letters, vol. 13, No. 9, Sep. 1992, pp. 471-472.

Mayer et al., "Electronic Materials Science: For Integrated Circuits in Si and GaAs" (1990), Macmillan Publishing Company, pp. 294-295.

Oct. 2, 2009 Reply to Aug. 6, 2009 Final Office Action of U.S. Appl. No. 11/925,723.

Notice of Allowance of U.S. Appl. No. 11/925,723 mailed Dec. 17, 2009.

Jan. 14, 2008 Response to First Office Action of Chinese Patent Application No. 200510076065.5 issued on Jun. 29, 2007.

Notice of Abandonment of Chinese Patent Application No. 200510076065.5 mailed Dec. 26, 2008.

Notice of Allowance of U.S. Appl. No. 11/925,723 mailed Jun. 11, 2010.

Terminal Disclaimer of U.S. Appl. No. 11/925,723 mailed Oct. 2, 2009.

Semiconductor International, "3D-ROM-A First Practical Step Towards 3D-IC" [online] [retrieved on Nov. 27, 2012] retrieved from the Internet: <URL: http://www.3d-rom.net/3D-ROM/3D-ROM%20-%20A%20First%20Practical%20Step%.

"Three-Dimensional Read-Only Memory (3D-ROM)" [online] [retrieved on Nov. 27, 2012] retrieved from the Internet: <URL: http://www.3d-rom.net/3D-ROM/3D-ROM.htm.

Submission of Prior Art Under 37 C.F.R. § 1.501 related to U.S. Appl. No. 12/899,634, now Patent No. 8,208,282, Aug. 20, 2012.

Notice of Allowance of related U.S. Appl. No. 12/899,634 mailed Feb. 24, 2012.

\* cited by examiner

VERTICALLY STACKED FIELD PROGRAMMABLE NONVOLATILE MEMORY AND METHOD OF FABRICATION

REFERENCE TO RELATED APPLICATIONS

This application is a continuation of U.S. patent application Ser. No. 12/899,634, filed Oct. 7, 2010, now U.S. Pat. No. 8,208,282, which is a continuation of U.S. patent application Ser. No. 11/925,723, filed Oct. 26, 2007, now U.S. Pat. No. 7,816,189, which is a continuation of U.S. patent application Ser. No. 11/355,214, filed Feb. 14, 2006, now U.S. Pat. No. 7,319,053, which is a continuation of U.S. patent application Ser. No. 09/939,498, filed Aug. 24, 2001, now U.S. Pat. No. 7,157,314, which is a continuation of U.S. patent application Ser. No. 09/714,440, filed Nov. 15, 2000, now U.S. Pat. No. 6,351,406, which is a continuation of U.S. patent application Ser. No. 09/469,658, filed Dec. 22, 1999, now U.S. Pat. No. 6,185,122, which is a division of U.S. patent application Ser. No. 09/192,883, filed Nov. 16, 1998, now U.S. Pat. No. 6,034,882, each of which is incorporated by reference herein in its entirety for all purposes.

BACKGROUND

This invention relates to low cost, high density semiconductor memories and, in particular to semiconductor memories whose contents are nonvolatile: data stored in the memory is not lost or altered when electrical power is removed.

There is an ever-increasing demand for ever-denser semiconductor memories, and customers continue to purchase these memories in ever-greater quantities, even as the number of bits per chip quadruples (approximately) every three years. Increasingly higher densities are required, at ever lower costs, to meet the needs of the marketplace.

Semiconductor nonvolatile memories may be divided into two categories: (1) those in which data is permanently written during the manufacturing process and whose contents cannot be subsequently changed, called "mask ROMs" or "factory programmed ROMs;" (2) those in which data may be supplied after the finished memory device leaves the factory. This latter category is called "field programmable memories" because their contents may be written, by the user, when the semiconductor memory chip is deployed to its final application, "in the field."

Field programmable memories are further subdivided into "write once" memories and "write/erase/rewrite" memories. Those written once are referred to as "PROM" (programmable read-only memories) or "OTP ROM" (one time programmable read only memories). And those memories that provide write/erase/rewrite capabilities have been referred to as "UVEPROM" (ultraviolet erasable programmable read only memories) or "EEPROM" (electrically erasable programmable read only memories) or "Flash EEPROM" (fast and flexible EEPROMs). In contrast, the contents of mask ROMs are permanently stored during manufacture, therefore mask ROMs are not erasable and are effectively "write only once, at the factory" memories.

Field programmable memories are much more flexible than mask ROMs, since they allow system product makers to inventory a single general part-type for many applications, and to personalize (program the memory contents of) this one part-type in numerous different ways, much later in the system product flow. This flexibility lets system manufacturers more easily adept to fluctuations in demand among different system products, and to update or revise system products without the expense of scrapping (discarding) existing inventories of pre-programmed mask ROMs. But this flexibility has a cost: field programmable memories generally achieve lower densities (fewer bits per chip) and higher cost (larger price per bit) than mask ROMs. Customers would prefer to buy something that offered the flexibility and convenience of a field programmable memory, while achieving the cost and density of a mask ROM. Unfortunately, such a device has yet not been available.

There are two reasons why mask ROMs have been denser and cheaper than field programmable memories. First, since mask ROMs do not support erase or rewrite functions, their peripheral circuits need not contain any dedicated circuitry or I/O terminals for input-data steering, for write timing, or for write control. Thus the peripheral circuits of a mask ROM may be smaller than those of a field programmable nonvolatile memory. This reduces the die size of a mask ROM, compared to the die size of a field programmable nonvolatile memory, allowing more mask ROM chips to fit on a semiconductor wafer, which lowers costs.

Second, since mask ROMs are written only at the factory, their memory cells may be designed and optimized for read operations exclusively, and generally their memory cells consist of only a single circuit element (e.g., a single MOS transistor). But the memory cell of a field programmable nonvolatile memory must include support for write operations. Therefore, field programmable memory cells generally contain more than one circuit element: generally a second tunnel oxide floating gate, or a write/erase series transistor, is added to the single MOS transistor needed for reading. The extra element(s) in the field programmable cell consume additional silicon area, making the memory cell area larger than the area of a mask ROM memory cell. Thus the density of field programmable nonvolatile memories has been lower than the density of mask ROMs.

Field programmable memories having write/erase/rewrite capabilities offer yet more flexibility. They permit product upgrades, field reconfiguration, and enable a host of new applications such as digital photography, solid state disks, etc. Unfortunately, these devices have generally suffered from lower density and higher cost than one-time programmable memories.

Turning now to the design of the memory cell used in these memories, most nonvolatile memory cells have employed semiconductor devices such as MOS field-effect transistors, junction transistors, or junction diodes, built in a planar monocrystalline semiconductor substrate. This approach allows only very limited integration vertically into the third dimension (i.e., perpendicular to the plane of the substrate), since each memory cell contains some elements built in the substrate.

Conventional nonvolatile memory cells are manufactured using a number of sequential photolithographic steps, which define the geometric shapes of the cell features. For example, fabrication of the prior art mask ROM cell shown in FIG. 1 requires at least five photolithographic masking steps: (a) nitride-LOCOS patterning; (b) polysilicon gate patterning; (c) contact patterning; (d) metal patterning; (e) programming with ion implant patterning. These steps are performed sequentially, and care is taken to align each subsequent layer to earlier layer(s) already patterned on the memory circuit to ensure that the geometric features of each layer will be printed in their desired spatial locations. For example, in the cell 10 of FIG. 1 the ion implant layer would conventionally be aligned to the polysilicon layer, which was patterned previously.

Unfortunately, photolithography machines used in high volume semiconductor manufacturing do not perform these alignments perfectly. They have a "layer misalignment tolerance" specification which expresses the alignment error that may result when aligning a new layer to a previously existing layer on the memory circuit. These misalignment tolerances force memory cell designers to use larger feature sizes than otherwise would be necessary if alignment errors were negligible.

For example, if a certain feature on the metal layer were required to completely overlap a feature on the contact layer, the geometric overlap between these two features would have to be designed at least as large as the misalignment tolerance between the contact layer and the metal layer. For another example, if a certain feature on the polysilicon gate layer were required to avoid and not touch a feature on the LOCOS layer, the geometric spacing between these two features would have to be increased to be at least as large as the misalignment tolerance between the polysilicon gate layer and the LOCOS layer.

Memory cell sizes are enlarged by these misalignment tolerances, which increase die size, decrease density, and increase cost. If a new memory cell structure could be found which required fewer sequential photolithographic steps, this cell would include fewer misalignment tolerances in its feature sizes, and it could be made smaller than a cell with more photolithographic steps.

And if a new memory cell structure could be found which had no alignment requirements at all (a "self-aligned" cell), in either the X- or Y-directions, it would not need to include any alignment tolerances in its feature sizes. The new cell could be made smaller than a corresponding non-self-aligned memory cell.

FIG. 1 depicts a very popular circuit design used in mask ROMs. It is an example of the "virtual ground" class of ROM circuits as taught, for example, in U.S. Pat. No. 4,281,397. Its memory cell such as cell 10, consists of a single MOS transistor built in the planar semiconductor substrate, connected to a polysilicon wordline (such as WL1, WL2), a metal bitline (such as BL1, BL2), and a virtual ground line (such as VG1, VG2). The cell is programmed by a mask which greatly increases the threshold voltage of the MOS transistor, e.g., by ion implantation. For instance, if implanted, the cell holds a logic-one, and if not implanted, the cell holds a logic-zero.

FIG. 2 shows a field programmable nonvolatile memory as taught, for example, in U.S. Pat. No. 4,203,158. Its memory cell 12 contains a wordline, a program line, a floating gate, a bit line, and a ground line. By application of suitable voltages on the bit line and program line, this cell can support write operations, erase operations, and rewrite operations as well as reading.

FIG. 3 shows a programmable logic array ("PLA") semiconductor structure as taught in U.S. Pat. No. 4,646,266. Its elemental cell 14 consists of a pair of back-to-back diodes, giving four possible states: nonconductive in either direction, conductive in both directions, conductive in a first direction but not in a second direction, and conductive in a second direction but not in a first direction. This structure is not built in a planar semiconductor substrate, and it does stack numerous layers of PLA cells vertically above one another to form a 3 dimensional structure.

Another type of prior art mask ROM circuit is taught in U.S. Pat. No. 5,441,907. Its memory cell contains an X conductor, a Y conductor, and a possible diode. The cell is programmed by a mask which permits (or blocks) the formation of a "plug" diode at the intersection of the X conductor and the Y conductor. For instance, if the diode is present, the cell holds a logic-one, and if it is absent, the cell holds a logic-zero.

A field programmable nonvolatile memory cell using both a fuse and a diode is taught in U.S. Pat. No. 5,536,968. If the fuse is unblown (conductive), the diode is connected between the X conductor and the Y conductor, and the cell holds a logic-zero. If the fuse is blown (not conductive), there is no diode connected between the X conductor and the Y conductor, and the cell holds a logic-one.

A field programmable nonvolatile memory cell using both a Schottky diode and an antifuse is taught in U.S. Pat. No. 4,442,507. Its memory cell contains an X-conductor made of polycrystalline semiconductor material, a Schottky diode, an intrinsic or lightly doped semiconductor that forms an antifuse, and a Y-conductor made of metal. The intrinsic or lightly doped semiconductor antifuse has a very high electrical resistance, and this corresponds to a logic-zero stored in the memory cell. But if a suitably high voltage is impressed across the cell, the antifuse switches to a very low electrical resistance, corresponding to a logic-one stored in the cell.

SUMMARY

In a first aspect of the invention, a memory cell is provided that includes a steering element, and a non-volatile state change element coupled in series with the steering element. The steering element and state change element are disposed in a vertically-oriented pillar. Other aspects are also provided.

In a second aspect of the invention, a method of forming a memory cell is provided. The method includes forming a steering element, and forming a non-volatile state change element in series with the steering element. The steering element and state change element are disposed in a vertically-oriented pillar.

Other features and aspects of the present invention will become more fully apparent from the following detailed description, the appended claims and the accompanying drawings.

DETAILED DESCRIPTION

A field programmable nonvolatile memory cell and memory array is disclosed. In the following description numerous specific details are set forth in order to provide a thorough understanding of the present invention. However, it will be apparent to one skilled in the art that the present invention may be practiced without these specific details. In other instances, well-known circuits and processes have not been described in detail in order not to obscure the present invention.

Overview of the Present Invention

The field programmable nonvolatile memory cell of the present invention is built above, rather than in, a planar substrate. Therefore, this memory cell can be stacked vertically in numerous layers to form a three dimensional array. Each layer of memory cells interacts only with the layer above and the layer below, which makes vertical stacking of layers quite simple.

A unique organization of these cells in a three dimensional memory array disposed above a substrate, with peripheral circuitry built in the substrate, is also described.

Figure 1:
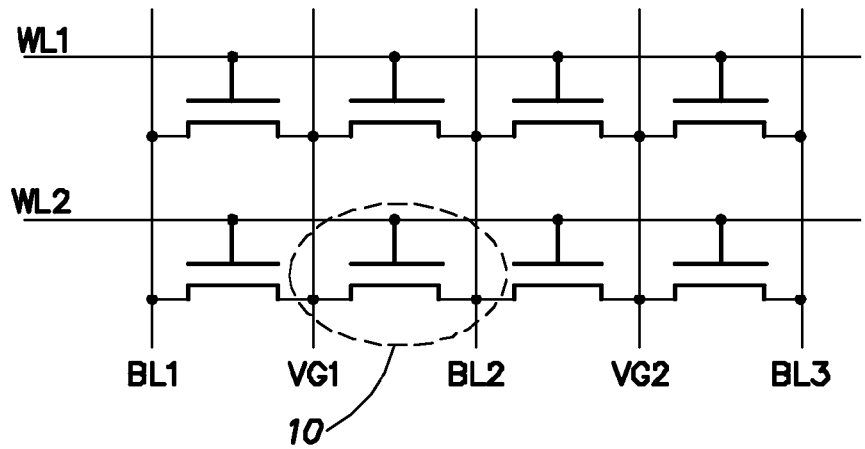
FIG. 1 is a circuit diagram of a prior art mask ROM.
Figure 2:
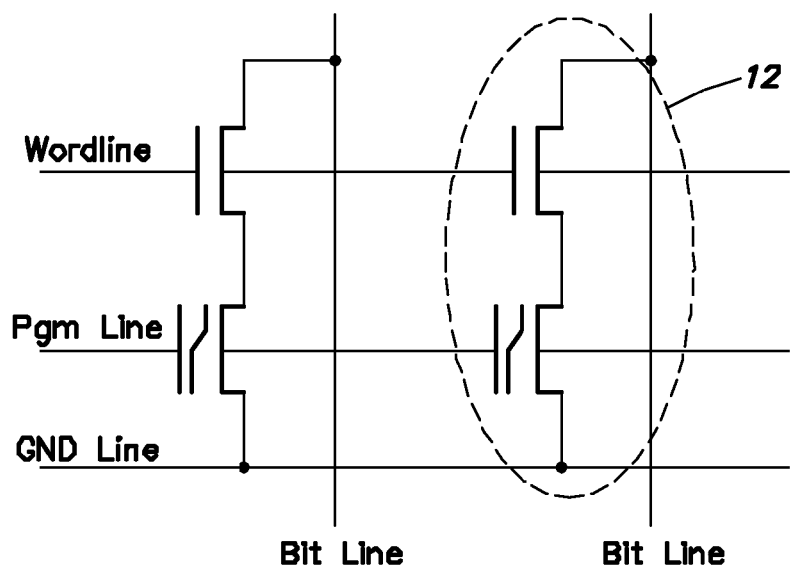
FIG. 2 is a circuit diagram of a prior art field programmable memory.
Figure 3:
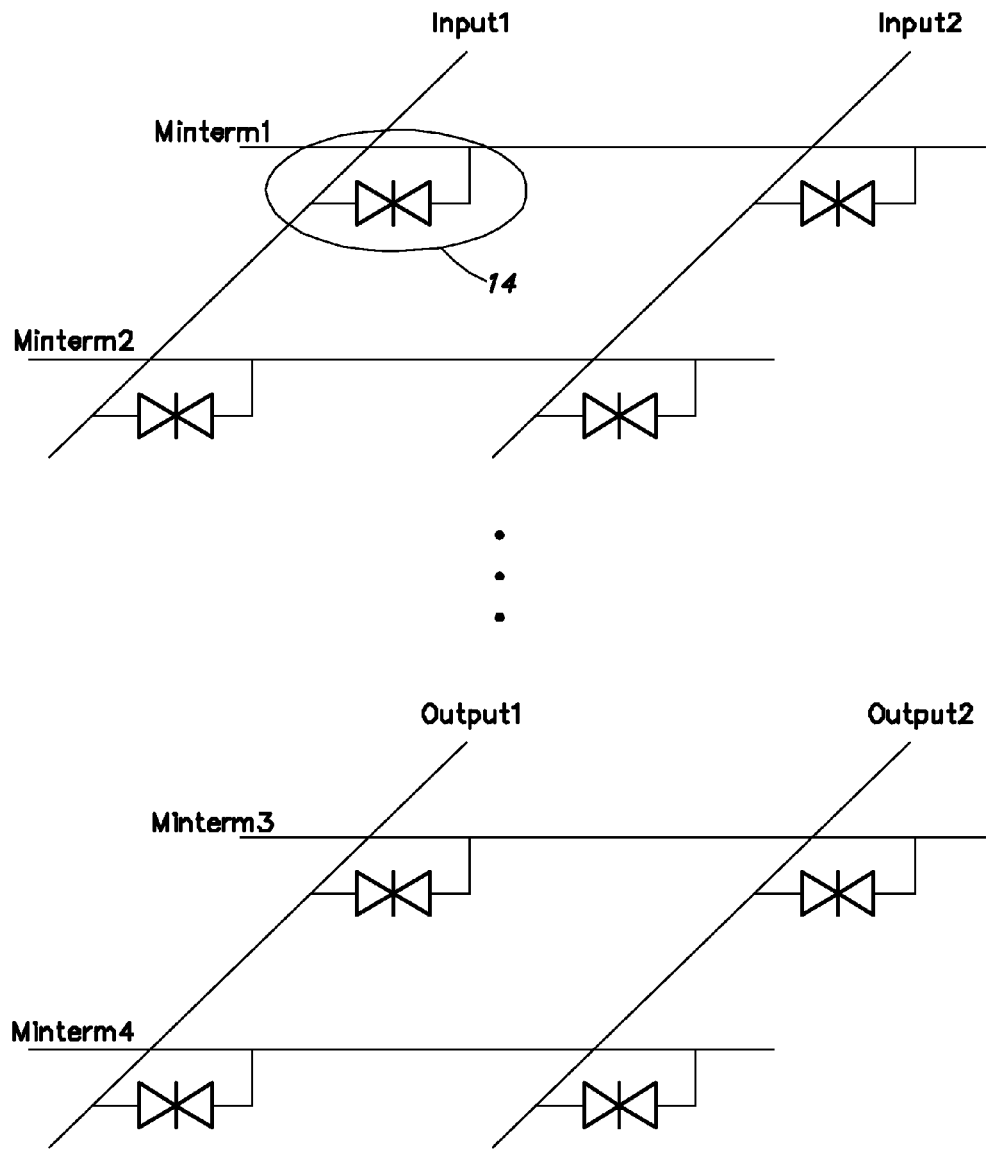
FIG. 3 is a circuit diagram of a prior art PLA.
Figure 4A:
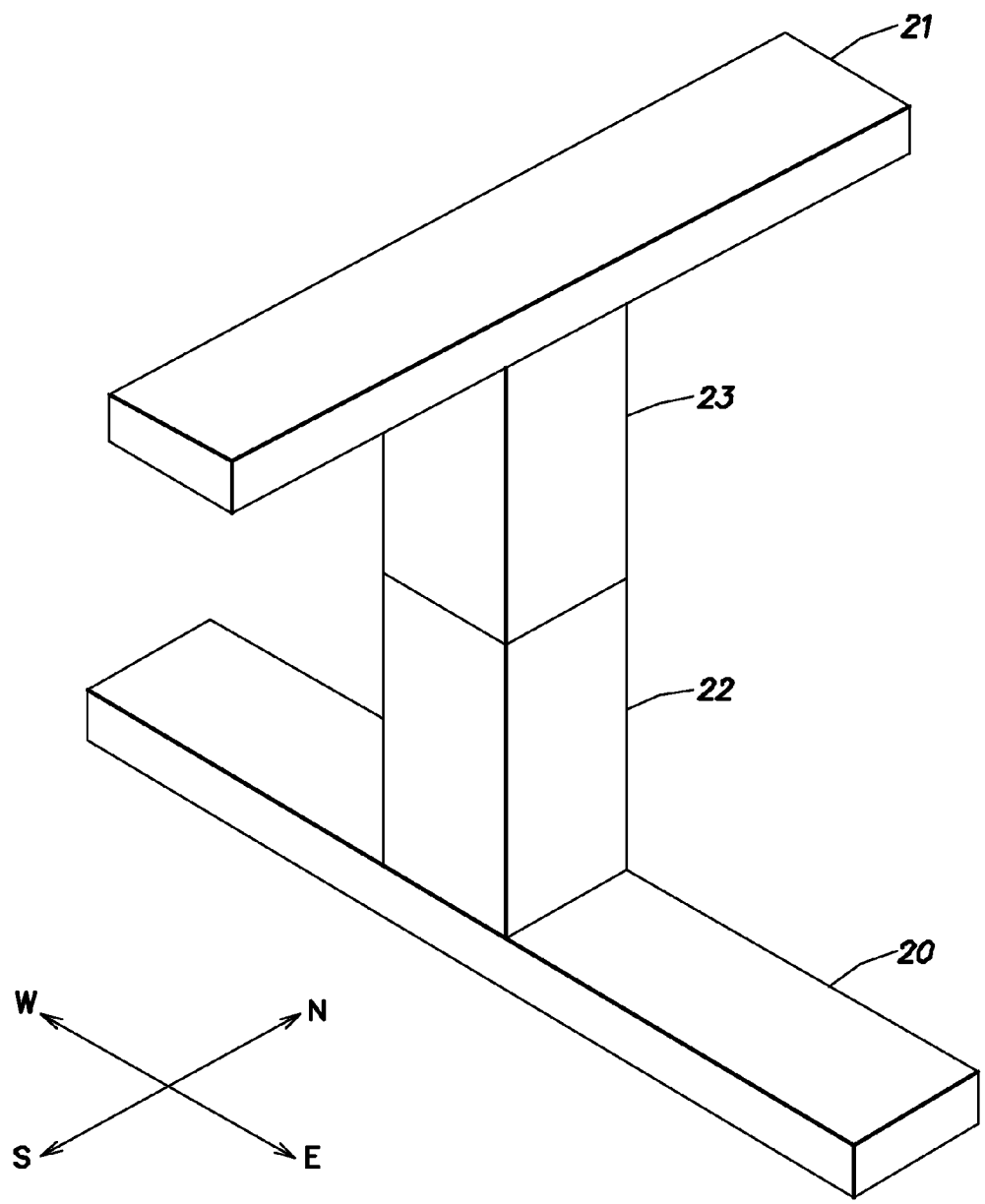
FIG. 4(a) is a perspective view of one embodiment of a memory cell built in accordance With the present invention.

FIG. 4(a) shows one embodiment of our newly invented memory cell. It has two explicit terminals: an input terminal 20 and an output terminal 21. Between these terminals, the memory cell contains a steering element 22 and a state change element 23 connected in series. Neither the input terminal 20, nor the output terminal 21, nor the steering element 22, nor the state change element 23 is built in the planar semiconductor substrate.

The steering element 22 is a device with a strongly asymmetric current-versus-voltage characteristic: it conducts more readily in one direction than in the other. The purpose of the steering element 22 is to ensure that current flow through the memory cell is substantially unidirectional. This unidirectional behavior enables the memory decoders to establish a unique circuit path to each individual memory cell, allowing it to be individually accessed (for reads and for writes) regardless of the state of all other cells.

The state change element 23 is a device which can be placed in more than one state, and whose state is not lost or altered when electrical power is removed. One possible implementation among the many discussed below, is a dielectric-rupture antifuse, having the states {high impedance} and {low impedance}. These two stored states accomplish the encoding of one bit of memory.

As shown in FIG. 4(a), the steering element 22 and the state change element 23 are stacked vertically in a "pillar" shaped arrangement having a generally rectangular cross-section. The pillar is vertical and so is the current flow. Depending on the orientation of the unidirectional steering element 22, current can flow either upwards or downwards. In fact, in one embodiment, current flows upwards in some layers of a vertical stack of cells, and downwards in the other layers.

The state change element 23 is chosen so that it can be switched from its initial state to another state by electrical means, thereby making the memory field programmable. For example, the state of a dielectric-rupture antifuse may be changed electrically by applying a relatively large voltage (when compared to the voltage used for reading) across the input and output terminals of the memory cell.

The memory cell of the present invention is capable of being fabricated with full self-alignment in both the X (east-west) and Y (north-south) directions. This means the pillars are defined by, and are automatically formed by, the intersection of an input conductor and an output conductor. Thus the cell can be made quite small, since its feature sizes need not include often used allowance for misalignment tolerances.

Figure 4B:
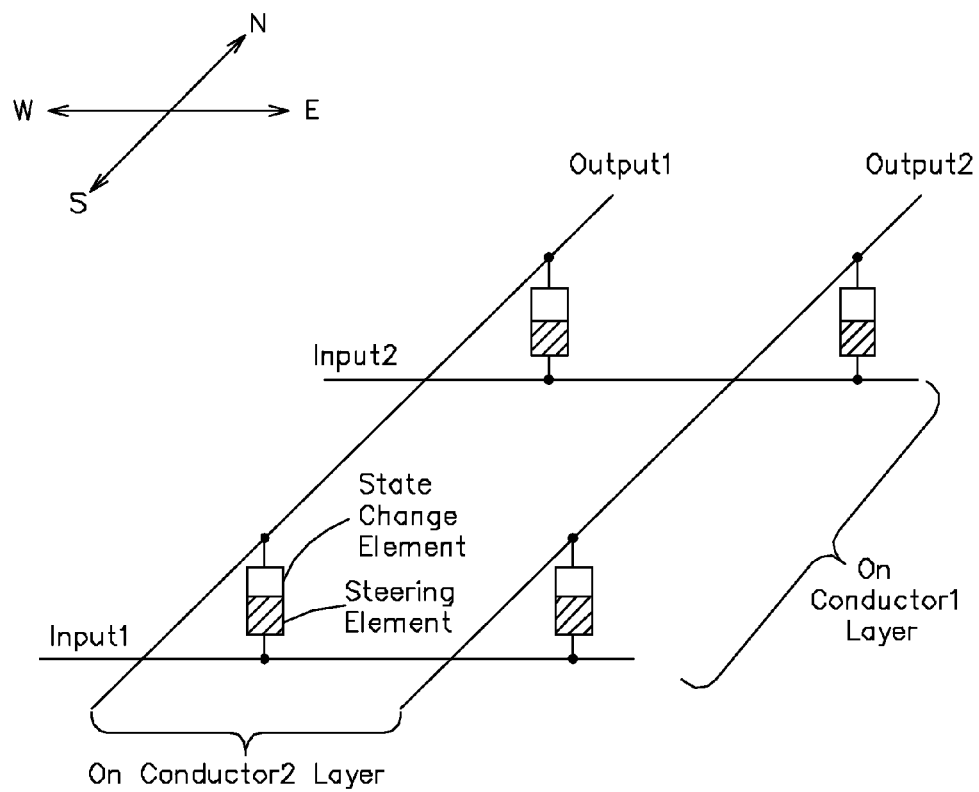
FIG. 4(b) is a schematic of an array using the cell of FIG. 4(a).

Furthermore, the number of photolithographic masking steps needed to build the cell of FIG. 4(a) is small. For a single level of cells as shown in FIGS. 4(a) and 4(b), three masking steps are needed: one to pattern the bottom conductor and cell material, another to pattern the upper conductor and cell material, and a third to provide contact holes outside the array for vertical electrical connections. This patterning scheme results in a self-alignment of the cell pillar (i.e., the steering element and the state change element) to the upper and lower conductors.

If a second level of cells is added vertically above the first level, only two additional photolithographic steps are needed: one for the next level conductor and the cell material, and the second for the contacts outside the array. The top conductor of the lower level of cells forms the bottom conductor of the top layer of cells. In general if the array contains (N) levels of cells, there are (N+1) conductor layers and (N+1) photomasking steps in the fabrication of the cell array itself. There are also a number of additional photomasking steps to form contacts. These contacts are outside the cell array; they make connection between the array conductor layers and the peripheral circuits.

The memory cell may also be fabricated using alternative embodiments. The self-aligned pillar formation described above may be replaced by a formation involving the use of a pillar formation photomask. This would eliminate the self-alignment of the pillar to the conductors, but would be advantageous in fabrication processes that could potentially exploit the physics of free sidewalls. These processes include steering element formation using solid-phase crystallization of amorphous silicon, laser crystallization of amorphous or polycrystalline silicon, and other processes apparent to persons skilled in the art.

The contact to the upper conductor layer in both the self-aligned fabrication process and the non-self-aligned fabrication process described above is exposed by the planarization of the insulation, requiring no photomask step. This process may be replaced by a contact formation photomasking step, as would be apparent to persons skilled in the art.

Figure 5:
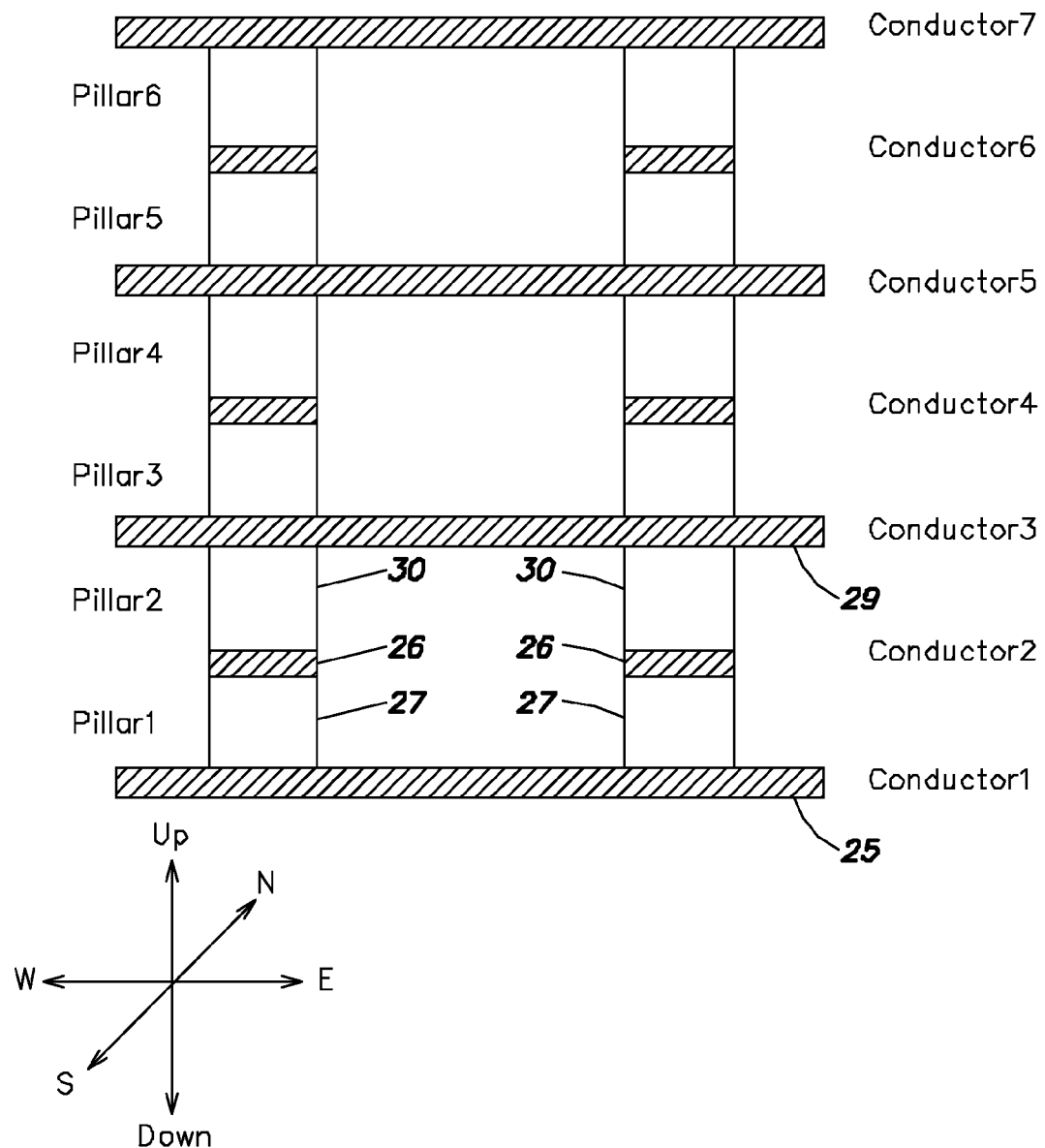
FIG. 5 is a cross-sectional elevation view of an array using the cell of FIG. 4(a).

Assume the first conductor 25 of FIG. 5 runs east-to-west. Then the second conductor 26 will run north-to-south (orthogonally), and memory cell pillars 27 will be formed wherever a vertical projection of the first conductor intersects the second conductor. The third conductor 29 will run east-to-west, and memory cell pillars 30 will be formed wherever the third conductor 29 intersects the second conductor 26. Similarly, the fourth, sixth, eighth, tenth, . . . conductors will run north-south, and the fifth, seventh, ninth, eleventh, . . . conductors will run east-west. Odd-numbered conductors run in one direction, and even-numbered conductors run in the perpendicular direction. Thus, conductor number J forms pillars downward (to wiring layer number J−1) and it forms pillars upward (to wiring layer number J+1).

Since the memory cells need not contact a monocrystalline semiconductor substrate, a substrate beneath the memory cell array is available for use other than for defining the memory cells. In one embodiment of the present invention, this area may be used to good advantage by laying out substantial portions of the row decoders, column decoders, I/O multiplexors, and read/write circuits directly beneath the memory cell array. This helps to minimize the fraction of the die surface area not devoted to memory cells, which increases the figure of merit known as "array efficiency:"

$$\text{Array Efficiency} = \frac{\text{total area devoted to } mem \text{ cells}}{(\text{total area devoted to } mem \text{ cells}) + (\text{total area devoted to non } mem \text{ cells})}$$

As can be seen, a decrease in (total area devoted to non-memcells) results in an increased array efficiency.

Memory Cell: Pillar

In the embodiment of the invented memory cell shown in FIG. 4(a), there are two explicit local terminals: an input terminal 20 (also called a wordline), and an output terminal 21 (also called a bitline). In addition the cell may also contain "implicit" or "widely shared" terminals which are unavoidable consequences of its construction, and which are common to large groups of cells at once. One example of an implicit terminal is the semiconductor substrate, which forms a parasitic capacitance to each memory cell. To simplify the figures and the discussion, these implicit terminals are omitted, but as will be appreciated these implicit terminals might affect the functionality and performance of the memory cell. Thus the invented memory cell is referred to as a "two terminal structure," meaning there are two explicit, local, terminals, possibly with additional terminals which are implicit rather than explicit.

Between its input terminal and output terminal, the memory cell consists of a series connection of a steering element and a state change element. In some embodiments, the steering element may be connected to the input terminal (and the state change element connected to the output terminal), and in other embodiments they may be reversed: the state change element may be connected to the input terminal and the steering element connected to the output terminal.

The steering element is a semiconductor element that has a strongly asymmetric current-versus-voltage characteristic; it conducts much more readily in one direction than in the other. Some possible implementations of the steering element are: (i) a PN junction diode, in amorphous, microcrystalline, polycrystalline or single crystal semiconductor (e.g., Si, Ge, SiGe, GaAs, InP, etc.); (ii) a metal-semiconductor Schottky diode; (iii) a junction field-effect transistor with gate connected to source (or to drain); (iv) a MOSFET with gate either floating, or connected to source or connected to drain; (v) a Zener diode, avalanche diode, or tunnel diode; (vi) a four-layer diode (SCR); (vii) a P-I-N diode in amorphous, microcrystalline, polycrystalline or single crystal semiconductor; and others that will be readily apparent to those skilled in the art.

For descriptive purposes in this disclosure the two ends of the steering element are referred to as "anode" and "cathode," arranged so that conventional current flows more readily from "anode" to "cathode" than from "cathode" to "anode." These labels are consistent with standard terminology for a PN junction diode: conventional current in a PN junction diode flows from anode to cathode. Of course the present invention is not limited to the use of a PN junction diode for its steering element (as was discussed in the preceding paragraph); the adoption of the same terminal labeling as a diode is merely for convenience and familiarity. Further, if the voltage on the steering elements anode is larger than the voltage on its cathode, the steering element is "forward biased." But when the cathode voltage exceeds the anode voltage, we will say the steering element is "reverse biased." These phrases are also borrowed from standard diode terminology, again for convenience and familiarity.

The steering element can be oriented two different ways: (1) with its anode facing the input terminal and its cathode facing the output terminal; (2) with its cathode facing the input terminal and its anode facing the output terminal. Either orientation can be made to function correctly, by appropriate design of the memory decoders and read/write circuits, and neither orientation is strongly preferred over the other.

The state change element is where data is actually stored in the memory cell. It is a device that can be placed in more than one state, and is so chosen that its state is not lost or altered when electrical power is removed.

Some examples of the types of states that may be employed in a state change element according to the present invention, are: (i) (high impedance state) and (low impedance state); (ii) (state with peak capacitance at voltage V1) and (state with peak capacitance at voltage V2); (iii) (state with Hall effect voltage positive) and (state with Hall effect voltage negative); (iv) (state with polarization vector pointing up) and (state with polarization vector pointing down) and others.

Some possible realizations of the state change element include, but are not limited to: (a) dielectric-rupture antifuses; (b) intrinsic or lightly-doped polycrystalline semiconductor antifuses; (c) amorphous semiconductor antifuses; (d) metal filament electromigration fuses, either of the reversible (U.S. Pat. No. 3,717,852) or irreversible type; (e) polysilicon resistor-fuses, either of the reversible (U.S. Pat. No. 4,420,766) or irreversible type; (f) ferroelectric capacitors; (g) capacitors with trap-induced hysteresis; (h) coulomb blockade devices, and others.

During integrated circuit manufacturing, the state change element of the memory cell is fabricated and placed in a certain one of its possible states, this is called the "initial state." For example, if the state change element is a dielectric-rupture antifuse having the two states (ruptured dielectric) and (intact dielectric), the initial state of this element is (intact) after manufacturing and before programming. Other embodiments of state change elements will have different sets of states and thus different initial states. By convention this initial state, the "logic zero" state denotes the initial value stored in the memory cell during semiconductor manufacturing. But of course other conventions, calling the initial state e.g., "logic one," would be equally valid, and the choice is merely a matter of preference or convenience rather than technological necessity.

The memory cell is programmed by causing the state change element to transition from its initial state into a new state. Many embodiments of the state change element can be caused to change state by applying a suitably large voltage across the memory cell, from input terminal to output terminal. For example if the state change element is embodied as a dielectric-rupture antifuse, it is programmed by applying a large voltage across the cell's terminals (or by forcing a large current through the cell), with the polarity chosen such that the steering element is forward biased. This places a large electric field directly across the dielectric antifuse, which ruptures the dielectric, thus changing the state of the state change element.

One possible method for programming a dielectric-rupture state change element is to ground the memory cell's output terminal and simultaneously raise its input terminal to a large positive voltage (assuming the steering element is so oriented that its anode faces the input terminal and its cathode faces the output terminal, i.e., steering element is forward biased when the input terminal is at a higher voltage than the output terminal). If the steering element is oriented the other way, with anode facing the output terminal and cathode facing the input terminal, the designer can simply reverse the programming voltages and keep the steering element forward biased during programming: ground the input terminal and simultaneously raise the output terminal to a large positive voltage. Many other voltage arrangements for forward biasing the steering element and programming a dielectric-rupture state change element will be readily apparent to those skilled in the art.

Other embodiments of the state change element can be caused to change state by forcing a suitably large current through the memory cell, rather than forcing a large voltage across the memory cell. For example, if the state change element is embodied as a polysilicon-resistor fuse, it may be programmed by connecting a current source to its input terminal and simultaneously grounding its output terminal (assuming this polarity forward biases the steering element). Assuming the current is large enough, it alters the resistance of the polysilicon-resistor fuse, thus changing the state of the state change element and programming the cell.

During programming, it is possible for non-selected memory cells to be reverse-biased by the full programming voltage. Accidental writes of non-selected memory cells might occur, if the reverse leakage current of the steering element exceeded the programming current necessary to change the state of the state change element. Thus, the characteristics of the steering and state change elements should be matched to one another: a state change element that requires a large current to program (e.g., an intrinsic poly fuse) can be used with a rather high-leakage steering element, while a state change element that programs at very low current (e.g., a dielectric rupture antifuse) requires a low-leakage steering element.

The invented memory cell can be embodied either as a one-time programmable nonvolatile memory, or as a write/erase/rewrite nonvolatile memory, depending on the state change element selected. In a first example, if a thin, highly resistive, polycrystalline silicon film antifuse is employed as the state change element (as taught in U.S. Pat. No. 4,146,902), its programming operation is irreversible and the cell is one-time programmable.

After manufacturing and before programming, all cells contain "logic zero." Those cells whose desired contents are "logic one" are programmed, irreversibly, by forcing the state change element into a new state. Logic zeroes may become logic ones (by programming), but logic ones may NOT become logic zeroes (since programming is irreversible in this type of state change element).

In a second example, if a metal-via-insulator-silicon filament fuse is employed as the state change element (as taught in U.S. Pat. No. 3,717,852), its programming operation is reversible, and the cell may be written, erased, and rewritten. After manufacturing and before programming, all cells contain "logic zero." Those cells whose desired contents are "logic one" are programmed. However, for this state change element, programming is reversible and logic values may be changed from zero to one and back from one to zero, if desired.

In a third example, a state change element having a write/erase/rewrite capability may be employed, whose programming operation is electrical but whose erase operation is not necessarily electrical. The erase operation may be selectively applied to a single memory cell, or it may be applied to all memory cells at once, "in bulk," such as by exposing them to a strong source of ultraviolet light as is done with UVEPROM memories. Or a bulk erase operation may be initiated by heating the integrated circuit, either from a heat source external to the IC or from a heater directly on the IC. Or a bulk erase might be initiated by placing the state change elements in a strong magnetic field.

While the above discussion is based on a state change element that has two states, this is not necessary. An antifuse that can provide a predetermined range of resistance where for instance it is partly fused, would provide a three state element. A floating gate MOS device allows numerous possible implementations of multi-level storage, providing more than two states for a state change element, as is well known in the art.

Memory Cell: Conductors

As shown in FIG. 4(a), the field programmable nonvolatile memory cell consists of a vertical pillar, with a conductor at the bottom of the pillar and another conductor at the top.

The bottom conductor is a relatively long conductor line or wire on a first conductor layer. This conductor runs in a certain direction (for example, east-to-west). The top conductor is a relatively long conductor line or wire on a second conductor layer, vertically above the layer that forms the bottom conductors. The top conductors run in another direction (for example, north-to-south). The angle between the top and bottom conductors is preferably ninety degrees (i.e., it is preferred they are orthogonal) but this is not mandatory. The memory cell pillar is located at the intersection where the top conductor crosses over a projection of the bottom conductor.

In practice the conductors on each level are parallel spaced apart conductors where for instance, the space between each conductor is equal to the conductor's width.

The first conductor layer ("conductors1") contains a large number of parallel conductors all running in the same direction, for example, east-to-west. And the second conductor layer ("conductors2") also contains a large number of parallel conductors all running in the same direction, for example, north-to-south, preferably perpendicular to the conductor direction of the first conductor layer as shown in FIG. 5. Wherever a conductor on conductors2 crosses over (or intersects) a conductor on conductors1, one of our field programmable nonvolatile memory cells is fabricated. This is shown in FIG. 4(b).

Vertically from bottom to top, the invented memory cell contains a conductor, then a pillar, then another conductor: conductors1→pillar1→conductors2. Conductors1 is on the bottom and conductors2 is on the top. But then conductors2 is the bottom of a new level of memory cells, vertically stacked above the first level: conductors1→pillar1→conductors2→pillar2→conductors3.

The present invention stacks multiple levels of memory cells above one another: a vertical stack having (N) levels of memory cells contains (N) levels of pillars and (N+1) layers of conductors. (It takes (N+1) conductor layers to make (N)

levels of cells: one conductor on the bottom of each level of pillars, and then one more conductor on the top of the array).

FIG. 5 shows a portion of a three dimensional memory array according to the present invention, having N=6 levels of memory pillars and (N+1)=7 conductor layers. A vertical stack of (N) pillars uses 1/N as much surface area as an assembly of (N) pillars that are not stacked vertically; vertical stacking gives an N-fold improvement in density.

A memory pillar's bottom conductor is the top conductor of the memory pillar below, and a memory pillar's top conductor is the bottom conductor of the memory pillar above. This makes stacking especially simple and flexible.

In one embodiment, the two conductors at either end of a memory pillar are perpendicular. And since conductors are shared between levels of pillars, the result in this embodiment is that even-numbered conductors run in one direction, and odd-numbered conductors run in the perpendicular direction. For example, suppose conductors1 runs east-to-west. Conductors2 would be perpendicular to conductors1, so conductors2 would run north-to-south. Conductors3 would be perpendicular to conductors2, so conductors3 would run east-to-west. Conductors4 would run north-to-south (perpendicular to conductors3), and so forth. Thus conductors 1, 3, 5, . . . run east-to-west, and conductors 2, 4, 6, . . . run north-to-south (in this example).

Fabrication

In one embodiment of the present invention, a conductor layer (say, conductor layer number J) runs north-to-south, and adjacent conductor layers (numbers J−1 and J+1) run east-to-west. Wherever a conductor's vertical projection on layer (J) crosses over a conductor on layer (J−1), a memory cell pillar is created. Similarly, wherever a conductor's projection on layer (J+1) crosses a conductor on layer (J), a memory cell pillar is created.

Memory cell pillars are defined and patterned by the intersection (crossover) of the conductors, and so the pillars are self-aligned to the conductors. Self-alignment is an extremely important advantage, because it lets the photolithographic patterns of the memory cell be designed without including any extra allowance for misalignment tolerances. Thus the pattern features of our self-aligned memory cell may be made smaller, resulting in a smaller cell area, which gives higher density and lower cost.

For purposes of illustrating the self-aligned fabrication of these pillars, consider an embodiment which uses four sequential layers of material (a "layer stack") to fabricate the steering element and the state change element. In this illustrative example, the steering element consists of a polycrystalline silicon PN junction diode, and the state change element consists of a poly-oxide-poly dielectric rupture antifuse. Other embodiments are set forth in the body of this application.

Figure 6A:
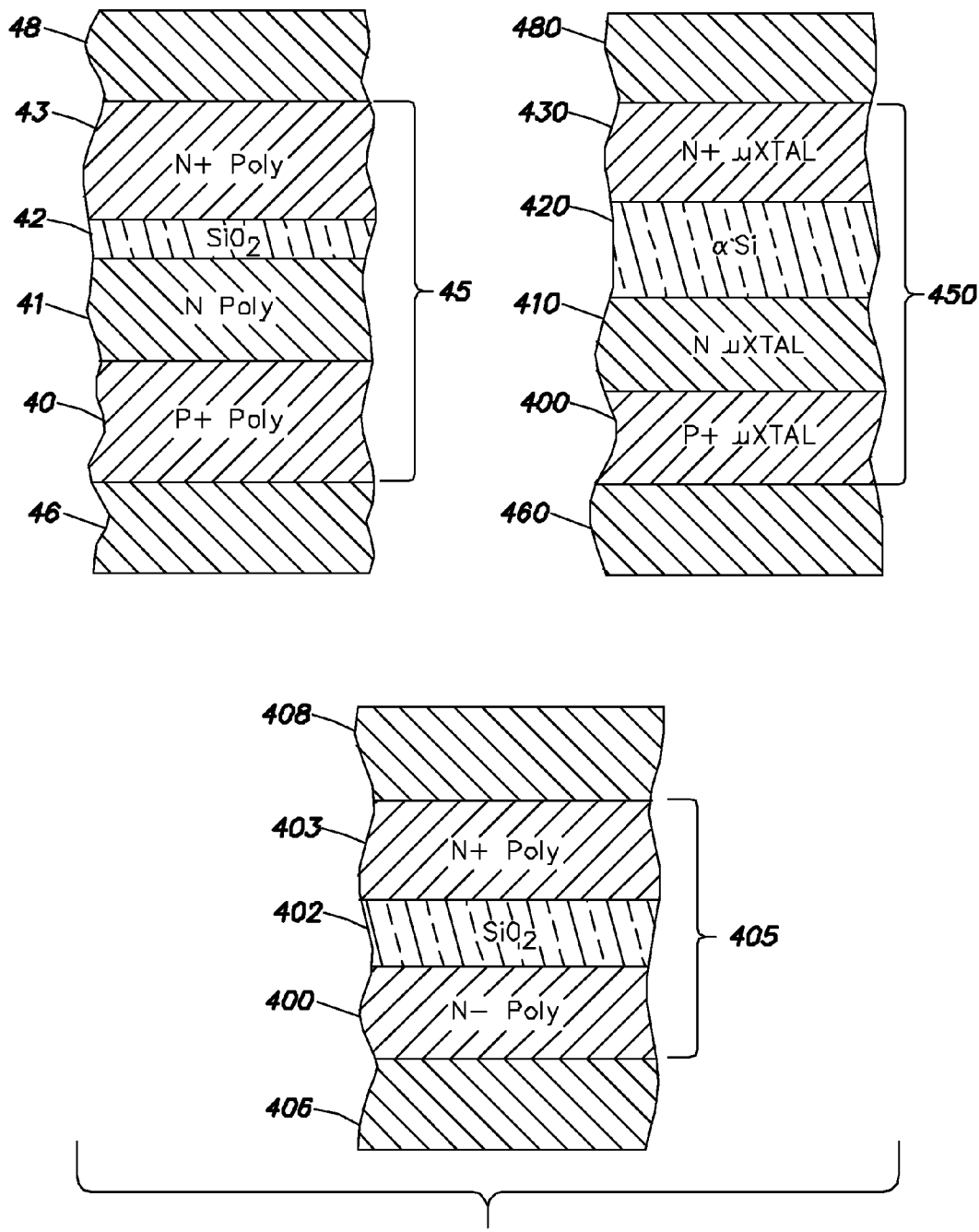
FIG. 6(a) are three cross-sectional views of layers used to fabricate different embodiments of the cell of FIG. 4(a).

In this embodiment, a pillar contains four layers of material in a layer stack, deposited sequentially as shown in FIG. 6(a): (1) a layer of P+ doped polysilicon 40; (2) a layer of N-doped polysilicon 41; (3) a layer of silicon dioxide 42; (4) a layer of N+ doped polysilicon 43. Layers (40) and (41) form a PN junction diode (the steering element), and layers (41-43) form a poly-oxide-poly dielectric rupture antifuse. In this embodiment the stack of four materials which together create the memory cells are referred to as the "layer stack" 45. There are also a conductor layer below and above the layer stack 45 which is patterned as will be described. These are shown as conductors 46 and 48 in FIG. 6(a).

An alternate stack is shown in FIG. 6(a) as stack 450. Again it includes conductors at the ends of the stack, specifically 460 and 480 which may be fabricated from any conductive material such as a metal or a polysilicon. The steering element in stack 450 comprises a first layer 400 of P+ doped semiconductor such as microcrystalline silicon, and a second layer 410 of N doped semiconductor such as microcrystalline silicon.

The state change element comprises the layer 420. Layer 420 may be an amorphous silicon layer used to form an antifuse. This layer has a nominal high resistance, however, after a large current is passed through it for programming, its resistance will be substantially lower. The layer 430 is shown as an N+ layer to provide good electrical contact to the overlying conductor 480. Layer 430 could be amorphous, microcrystalline or polysilicon but the processing methods need to be low temperature to maintain the amorphous structure in layer 420.

Another stack 405 is also shown in FIG. 6(a). It comprises an N-polysilicon layer 400, a silicon dioxide layer 402 and an N+ polysilicon layer 403. Again, the layers 400 or 403 could be microcrystalline or amorphous semiconductor layers. The stack 405 is sandwiched between the conductors 406 and 408. Here the steering element is a Schottky diode formed by the metal of conductor 406 and the layer 400. The state change element is an antifuse formed by layer 402. By way of example, layers 406 and 408 may be titanium silicide or aluminum with a thickness of approximately 1000 Å. The layers 400, 402 and 403 may be 500 Å, 80 Å, and 500 Å in thickness, respectively.

Figure 6B:
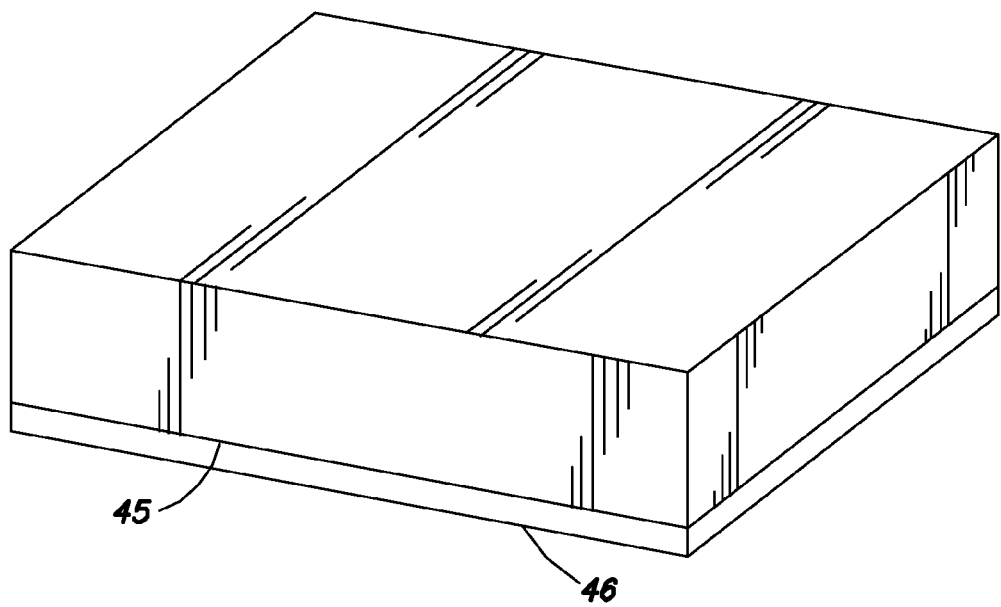
FIG. 6(b) is a perspective view of a conductor layer and layer stack used in the fabrication of the cell of FIG. 4(a).
Figure 6C:
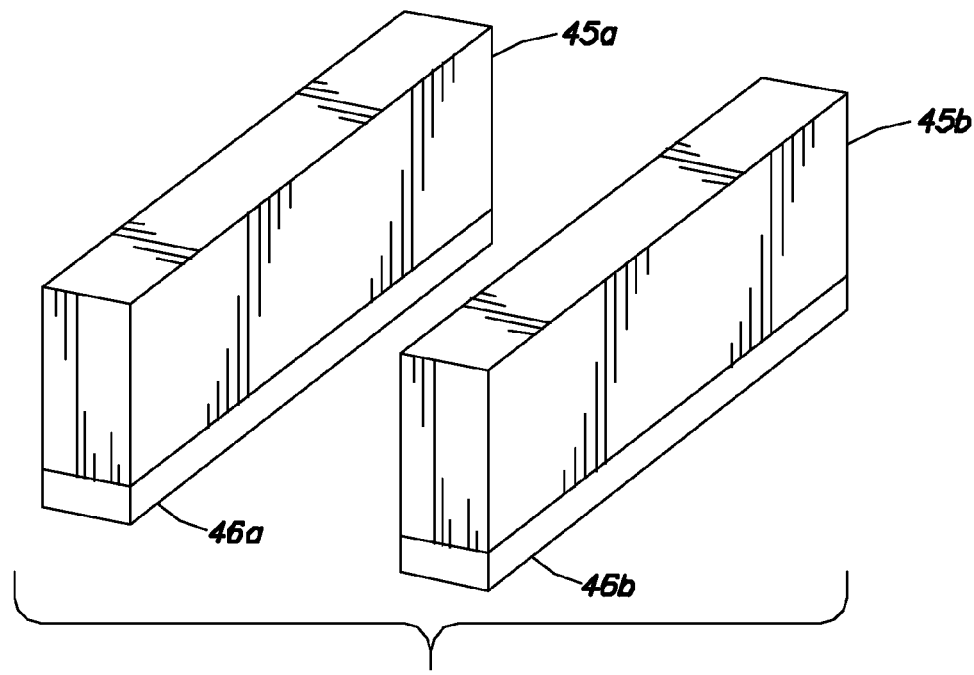
FIG. 6(c) illustrates the structure of FIG. 6(b) after patterning.
Figure 6D:
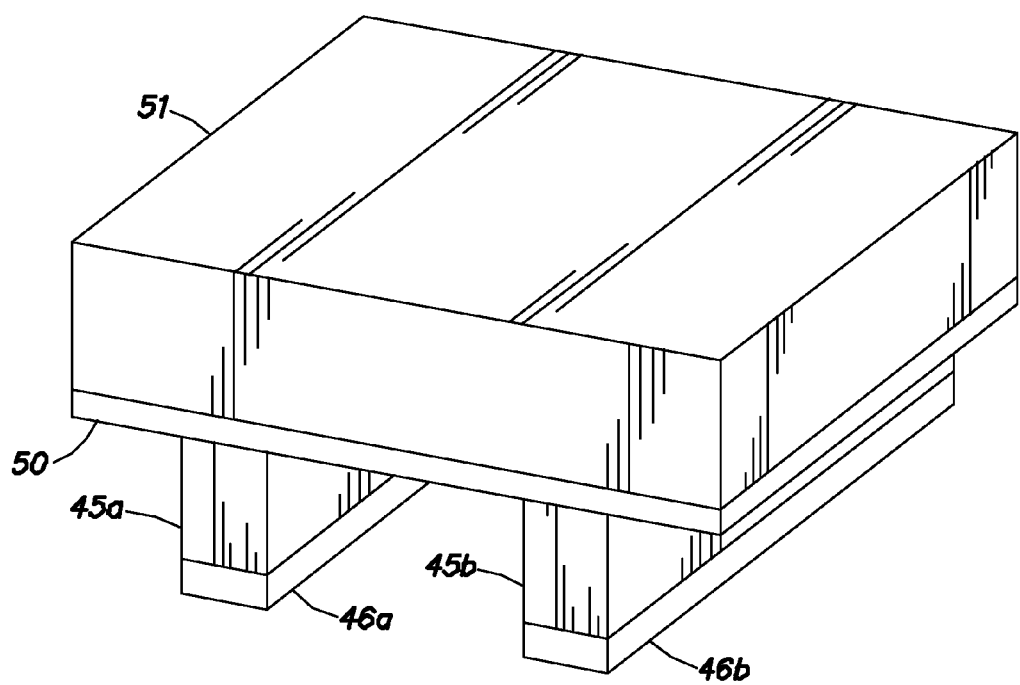
FIG. 6(d) illustrates the structure of FIG. 6(c) after an additional conductor layer and layer stack have been formed.
Figure 6E:
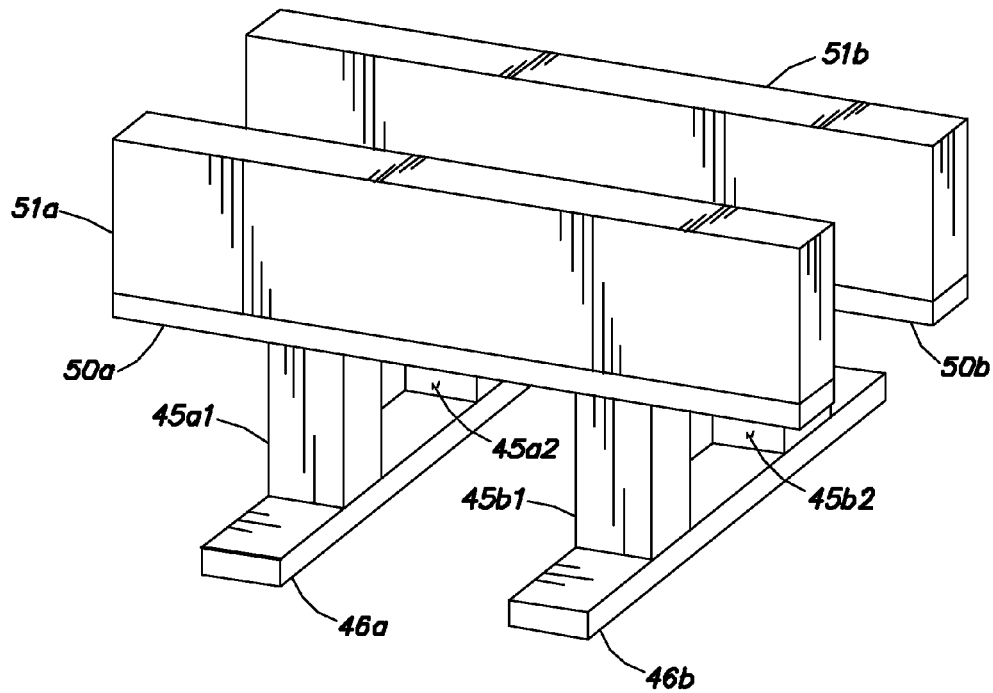
FIG. 6(e) illustrates the structure of FIG. 6(d) after patterning.
Figure 6F:
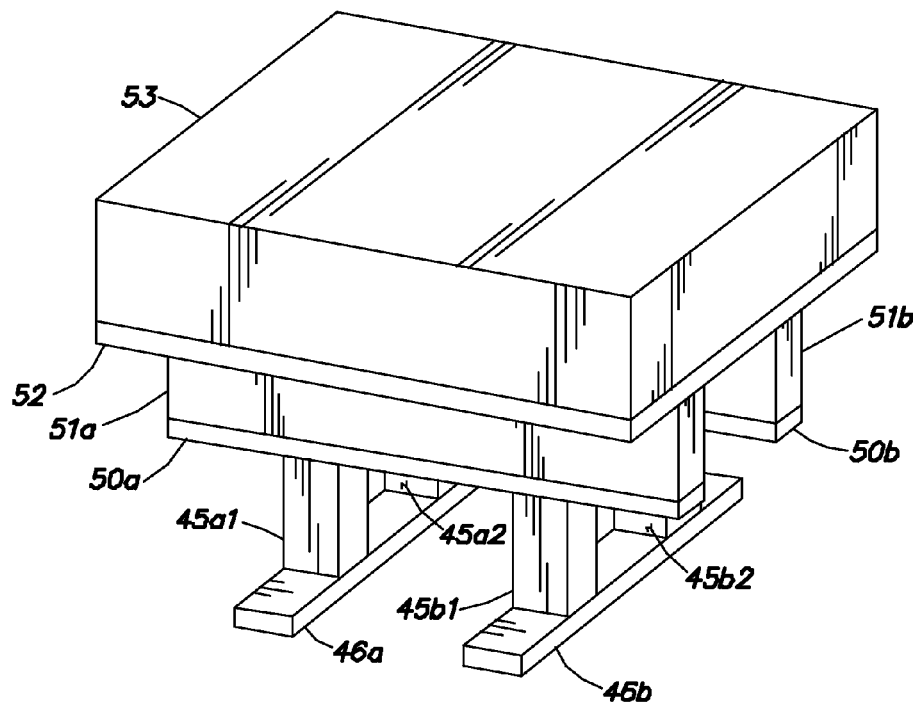
FIG. 6(f) illustrates the structure of FIG. 6(e) after an additional conductor layer and layer stack have been formed.
Figure 6G:
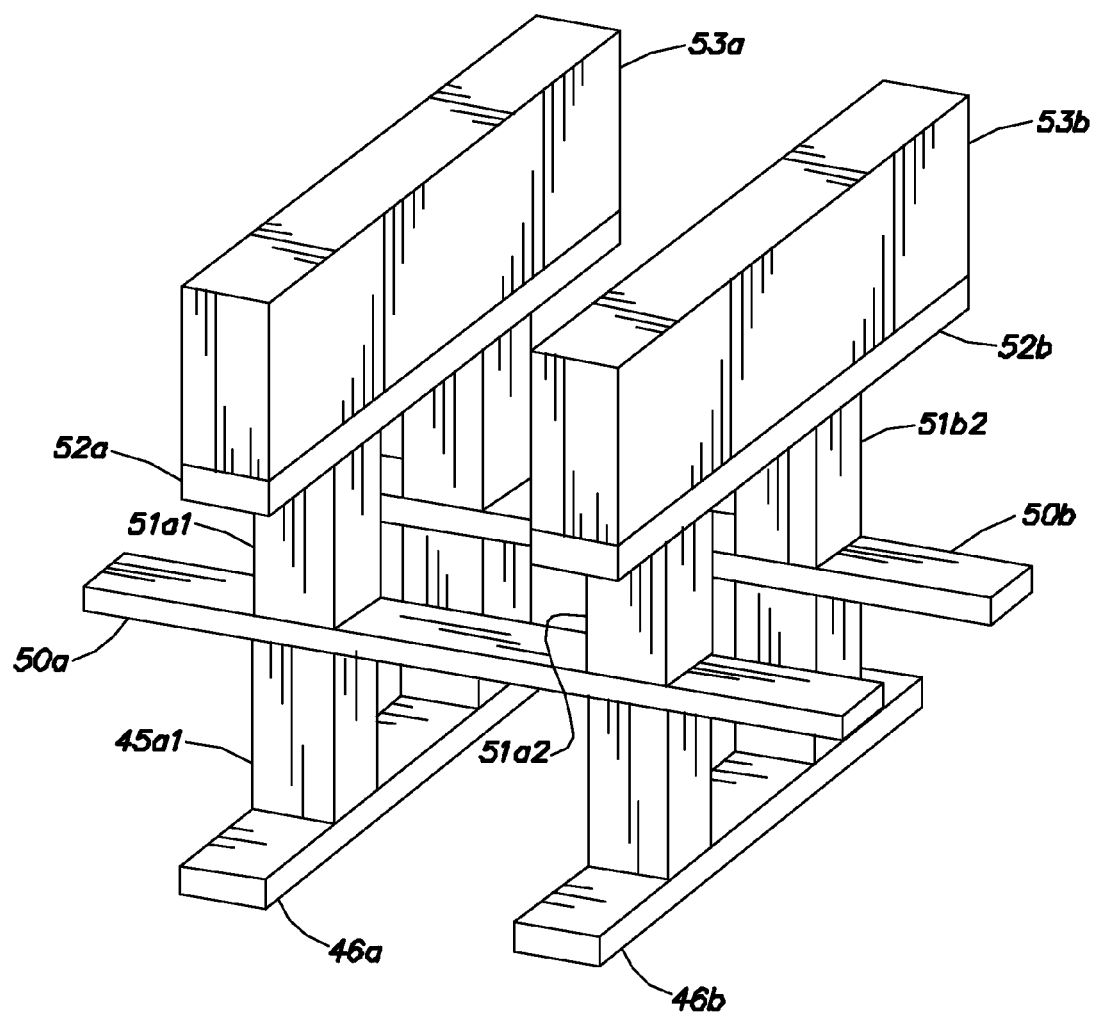
FIG. 6(g) illustrates the structure of FIG. 6(f) after another patterning step.

The fabrication sequence for the memory cell is schematically illustrated in FIGS. 6(b)-6(g). After deposition and before patterning, the layer stack 45 (or the stacks 450 and 405) is a continuous sheet that extends across the entire integrated circuit (indeed across the entire wafer) such as shown in FIG. 6(b).

Conceptually the self-alignment method is a two-etch-step procedure: In the first etch step, this layer stack (a continuous sheet) is patterned into long straight strips running (e.g., east-to-west) by etching them with the same patterning step that etches the east-to-west conductors on the conductor layer below. After deposition and planarization of an interlevel dielectric, a second conductor and layer stack is deposited. This stack is patterned into long straight strips running north south.

Etching used to pattern the north-to-south lines continues until the first layer stack has also been etched through the steering element. This results in pillars formed on the east-to-west running lines. The resulting pillars are perfectly aligned to both the conductor below and the conductor above since both the pillars and the conductors are etched simultaneously. In alternate embodiments, the semiconductor layers within the layer stack (45 or 450 or 405) may be deposited as microcrystalline or polycrystalline, and then laser treated to improve crystallinity and enhance the dopant activation.

The cross-section of the pillar will be rectangular with one dimension being equal to the width of the bottom conductors and the other dimension equal to the width of the top conductors. If these conductors have equal width then the cross-section will be square.

The patterning in both east-to-west and north-to-south uses well-known photolithographic steps widely used in the semiconductor industry and may use either wet or dry etching. Also, the silicon used in the cells and when used for the conductors may be doped in-situ or after being deposited, for example, by ion implantation.

Of course other patterning technologies may be used rather than etching, for example "liftoff" technology or "Damascene" technology or an additive rather than subtractive patterning technology may be employed instead of etching. But ideally the layer stack should be patterned in two separate steps, once with the mask that defines the conductors below, and again with the mask that defines the conductors above. This holds true regardless of the specific fabrication techniques used to pattern the various layers.

In practice, a large number of vertically stacked memory cells are built, and each conductor layer is self-aligned to both the layer stack below and the layer stack above. Therefore the etching steps which self-align the conductors to the pillars, must etch away material from three different layers: the layer stack above, the conductor layer, and the layer stack below.

The processing may begin with a wafer that may have received prior processing steps, for example, CMOS transistors may be fabricated in the monocrystalline substrate for the peripheral circuitry. An insulator then is deposited, and preferably, planarized (using chemical-mechanical polishing ("CMP"), resist etchback planarization, or any of a number of other technologies for planarization). The first conductor layer is deposited such as layer 46 of FIG. 6(*b*), and then the first layer stack 45 is deposited. FIG. 6(*b*) shows the wafer at this stage.

Next, the mask which defines the features on the conductors1 layer is applied, and these features are etched into both the pillar layer stack 45 and the conductors1 layer 46 below. An insulator is deposited on the wafer and planarized, using CMP or other planarizing technology. FIG. 6(*c*) shows the wafer at this stage. Note in particular that the pillar layer stack and bottom layer have, been etched into long continuous strips (46*a* and 45*a*) and (46*b* and 45*b*), not isolated individual pillars.

Also note that the edges of the pillar layer stack 45*a* and 45*b* are aligned to the edges of the conductor 46*a* and 46*b* layer, since both were etched at the same time with the same mask. Note the conductors generally comprise coplanar conductors, such as aluminum or other metals, silicides, or doped silicon conductors, for each level.

While not shown in FIG. 6(*c*) or the other figures, the dielectric fills the voids between the strips (and pillars) and thus adds support to the array. Also it should be noted that the planarization must reveal the upper surface of the strips so that the conductor layer that follows contacts the strips. The planarized dielectric also forms the layers through which the vias and vertical conductors of FIG. 13 pass.

Next, the second conductor layer 50 ("conductors2") is deposited, and the second pillar stack 51 ("stack2") is deposited. FIG. 6(*d*) shows the wafer at this stage. Note that the planarization automatically gives a self-aligned contact between a pillar layer stack (such as 45*b*) and the subsequent conductor layer (such as 50) above it.

Now, the conductors2 mask is applied, and its features are etched downward into three distinct strata: pillarstack2 (51), conductors2 layer 50, and pillarstack1 (45*a* and 45*b*). (This etch stops below the steering element within 45*a* and 45*b*, providing a unique circuit path through the memory cell). An insulator is deposited on the wafer and planarized (using CMP or other means). FIG. 6(*e*) shows the wafer at this stage. Note that the conductors2 mask+etch has completed the definition of the individual pillars (45*a*1, 45*a*2, 45*b*1 and 45*b*2) in the layerstack1. Also note that these pillars in the layerstack1 layer are aligned to both the conductors1 layer (46*a*, 46*b*) and to the conductors2 layer (50*a*, 50*b*), thereby achieving the goal of self-alignment.

Next, the third conductor layer 52 ("conductors3") is deposited, and the third pillar layerstack 53 ("layerstack3") is deposited. FIG. 6(*f*) shows the wafer at this stage.

Now, the conductors3 mask is applied, and its features are etched downwards into layers stack3, conductors3, and stack2. This etch stops below the steering element of layer stack 2 and is intended to leave the conductor2 layer intact. An insulator is deposited on the wafer and planarized (using CMP or other means). FIG. 6(*g*) shows the wafer at this stage. The conductors3 mask+etch has completed the definition of the individual pillars in the layerstack2 layer (such as 51*a*1, 51*a*2, 51*b*2). FIG. 6(*g*) shows that (N+1)=3 conductor layers and hence (N+1)=3 masking steps, are required to pattern (N=2) layers of pillar layerstack (not counting the interlevel via layers which are used in the peripheral circuits but not in the memory array). The wafer is now ready to receive more stack layers and conductor layers, at the discretion of the manufacturer.

In one possible embodiment of an array of the invented memory cells the pillars are vertically stacked directly above one another as illustrated in FIG. 6. Note that pillars are lined up in vertically aligned stacks. However, because of self-alignment, this vertical stacking of pillars directly above one another is not a requirement.

Figure 7:
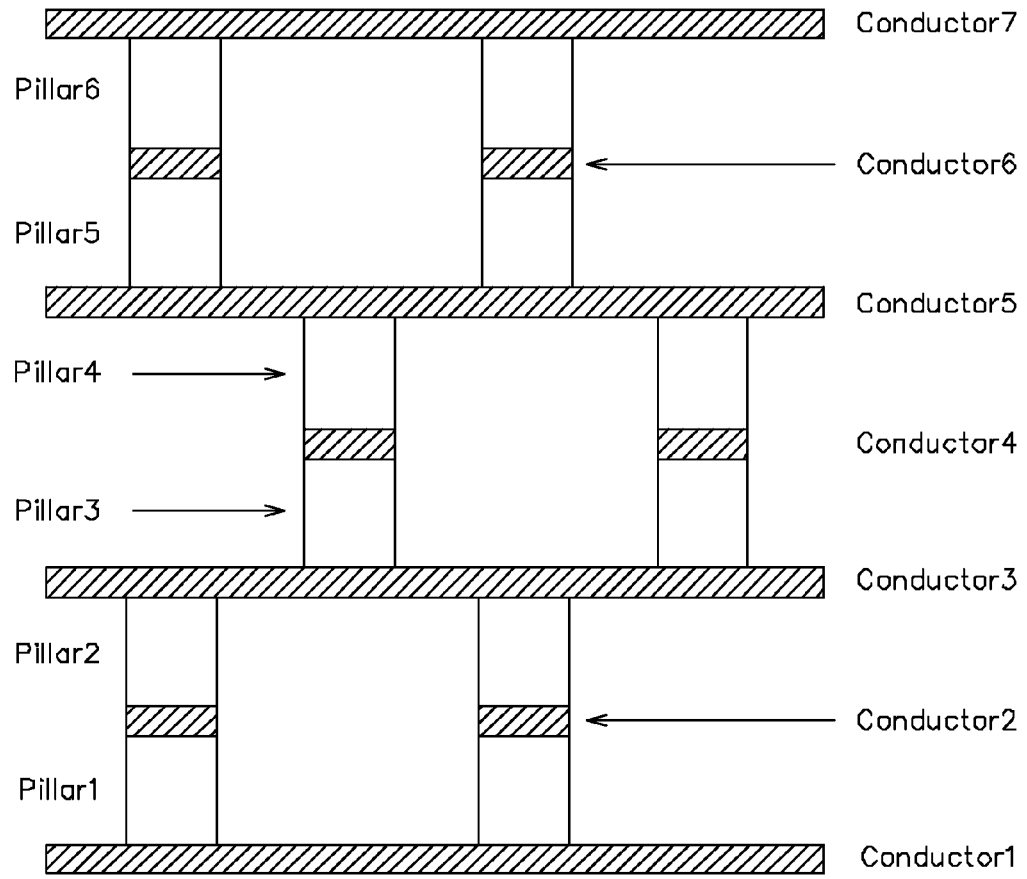
FIG. 7 is a cross-sectional elevation view of an array using the cell of FIG. 4(a) where the cells are staggered in the vertical direction.
Figure 7:
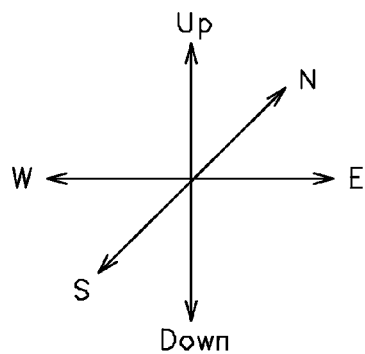

Memory cell pillars are automatically formed wherever a conductor on conductor layer (J+1) crosses over a conductor on conductor layer (J). This is true even if the conductor layers are not lined up directly above one another, giving vertical stacks of pillars. In fact it may be preferred that the pillars not be stacked vertically; that is they are offset from one another, as illustrated in FIG. 7. Compare FIG. 5 (vertical stacks of pillars) to FIG. 7 (pillars offset from one another) to see the effect. Offset or staggered pillar placement such as shown in FIG. 7, may be advantageous in practice. it may help give a smoother wafer surface, more suited to planarization and polishing.

In the foregoing sequence of steps, electrode or conductor material is etched along with device material. Since most plasma metal etches also etch polysilicon, a practical combination of materials that enables such dual etching would be aluminum and polysilicon, for example. Control of the etching process may be effected, if desired, through the use of etch chemistries that are selective (e.g., preferentially etching polysilicon, but stopping on aluminum), or through the use of barrier materials that are not etched by the etchants that remove electrode and device material. The state change element may also be used as an etch stop, particularly if it is an oxide rupture type.

Refractory metals such as molybdenum and tungsten are compatible with conventional CVD deposition temperatures for Si and may be used for the conductors. Metal silicides are compatible with even higher temperatures used to activate dopants in Si. Even heavily doped Si itself can be used as a conductor. The choice may be dictated based on resistivity and integration concerns including etch characteristics.

The planarization described after the first half-step of the foregoing is necessary to form self-aligned contacts to the half-etched cells (i.e., the lines running in the east-west direction in the foregoing example). Such planarization may be effected through a variety of means well known in the art, such as chemical-mechanical polishing (CMP), etched-back spin-on dielectric layers, and etched-back spin-on polymers, to cite three well-known examples. To tolerate the possibility of excessive over-polishing or over-etching that may occur during planarization, a second planarization may be performed after deposition of an electrode layer to insure a planar electrode surface for subsequent deposition of device material layers.

The foregoing process sequence exploits self-alignment to reduce the required alignment tolerances between the pillar and the conductors. This embodiment may be substituted with an embodiment involving one or more additional photomasking steps to explicitly define the pillar itself, rather than defining it using the intersection of two conductor photomasking steps, as is done in the self-aligned process. This may be advantageous in various processes that could exploit the explicitly defined sidewalls that would result from such a process.

For example, solid-phase crystallization of amorphous silicon could be used to form the steering element layer stack. The free energies of the sidewalls would be expected to favor the formation of a single crystal or grain within the steering element, which may be advantageous in some system embodiments.

Another process that could exploit explicitly defined sidewalls is laser-induced crystallization. Again, the free energies of the sidewalls would be expected to favor the formation of a single crystal or grain within the steering element.

In processes involving the explicit definition of the pillar, a photomasking step would be used to define a bottom conductor. This would be etched. Then, the layer stack required to form the state change and steering elements would be deposited. Another photomasking step would be used to define the pillar, which would be etched. After this etch, an insulating material would be deposited and planarized as in the self-aligned cell, exposing the top of the pillar to form a self-aligned contact. The top conductor would then be deposited and the process would be repeated for subsequent levels of cells as required.

The order of masking steps in the above process could also be reversed. For example, the pillar could be formed prior to patterning the bottom conductor. In this process, the entire layer stack for the bottom conductor, the steering element, and the state change element would be deposited. The pillar would then be lithographically defined and etched down through the steering element. The bottom conductor would then be defined and etched. This structure would be passivated using a planarized insulator contacting scheme, as described above. In all three processes, the self-aligned contact could also be replaced by an explicit contact forming photomasking step.

The various device fabrication steps may result in the presence of residual chemicals or dangling bonds that may degrade device characteristics. In particular, device leakage can result from the presence of such dangling bonds or chemicals (e.g., incompletely removed photoresist). A low-temperature (e.g., <400° C.) plasma oxidation exposure may be used to grow a clean-up oxide on the edges of the device pillar, thereby passivating edge traps.

The growth of the oxide is self-limiting because the oxygen species diffuse only slowly through previously grown oxide, resulting in extremely uniform oxide thickness and, therefore, improved manufacturability. Plasma oxidation may also be used to form an anti-fuse layer. Oxide deposition may also be used to passivate the surface, for example, either alone or in conjunction with a grown oxide.

Because, in the foregoing for some embodiments, device material (e.g., polysilicon) is deposited after electrode material (e.g., metals), it is desirable to deposit and process the device material at the lowest practical temperatures to widen the selection of suitable metals. As an example, in-situ doped polysilicon may be deposited at low temperatures using LPCVD low pressure chemical vapor deposition ("LPCVD"), plasma-enhanced chemical vapor deposition ("PECVD"), physical vapor deposition ("PVD"), or ultra high vacuum chemical vapor deposition ("UHVCVD").

An alternative is to deposit undoped polysilicon, followed by doping and activation using a low temperature process. Traditional activation steps such as long thermal anneals expose the wafer to potentially unacceptably high temperatures. It may also be desirable in some cases to substitute microcrystalline or amorphous silicon or crystallized amorphous silicon for the polysilicon to enable low temperature fabrication.

Another concern is the possibility of diffusion of electrode material (e.g., metal) into the device layer during processing. Low temperature processing helps to reduce the severity of this problem, but may be insufficient to solve it completely. To prevent this problem, a number of barrier materials may be employed. Examples include titanium nitride ("TiN"), tantalum ("Ta") or tantalum nitride ("TaN"), among many that are well known to the art.

In one embodiment of the cell, a thin dielectric layer is employed as an antifuse element. In such a cell, good uniformity of dielectric thickness, as well as a low film defect density (e.g., of pinholes in the dielectric) are among highly desirable properties. The quality of the dielectric may be enhanced through a variety of means, such as rotating (continuously or periodically) the substrate and/or source during deposition; forming the dielectric by thermal means using plasmas or low-temperature growth chemistries; or by employing liquid-phase dielectric deposition means.

It is desirable to reduce the number of masking steps that involve critical alignment tolerances. One method for reducing the number of masking steps is to employ vias that interconnect several electrode layers. The vias may be rectangular, rather than square, to allow a relaxation in alignment tolerances. For example, to interconnect metal lines in several layers running in the x-direction, the x-edge via size may be made substantially looser than the pitch of the x-lines in the y-direction, resulting in a rectangular via. Vias are discussed in conjunction with FIGS. 12 and 13.

Contact Formation

As previously pointed out, approximately one masking step per layer is needed to form the cells in the memory layer. Additional masking, however, is needed to form contacts, vias and vertical conductors (collectively sometimes referred to as contacts) to the conductors in the array as will be discussed below. First it should be recalled that only one contact need be made to each of the array conductors. Thus, if the contacts are at the ends of the array conductors, the contacts for every other conductor at a given level may be on opposite sides of the array. This is important since it provides more area for the contacts. Additionally, the conductors on the same level need not be of the same length. That is, for instance, they can be progressively shorter, or longer, or longer in some layers and shorter in others, to allow area on the periphery of the array for contacts. These contacts can reach down to lower levels, for instance, every other lower level without interfering with conductors in the intermediate layer.

Contacts are required outside the array to connect the conductors in the array to the drive circuitry. Transistors built into the substrate will typically provide drive. Drive transistors could also be built above the substrate using materials common to the array. The simplest implementation of contacts is to have a via mask for each level of the array. These contacts are used to connect an upper level through all the levels below it to electrically connect to the substrate. These contacts are built either stacked directly over one another or staggered, both methods being common in the semiconductor industry.

In general, the vias and contacts are used to provide conductive paths between the conductors in the array and the periphery circuitry. For instance, contacts are formed in the periphery of the array to contact the decoders, column I/O circuitry and row address decoders shown in FIGS. 9(*a*), 9 (*b*) and 9(*c*). In another embodiment it may be desirable to fabricate the array on, for instance, a glass substrate and to form the peripheral circuitry on a layer employing thin film transistors with the contacts providing conductive paths from that layer to the conductors in the array in another embodiment, the upper most layer may be used for power distribution.

One straightforward plan for making contact with each of the levels is to use one masking and etching step per level, which step occurs before the formation of the layer used to define the conductors. This masking step forms openings to the layer beneath and provides contacts as needed.

Figure 12:
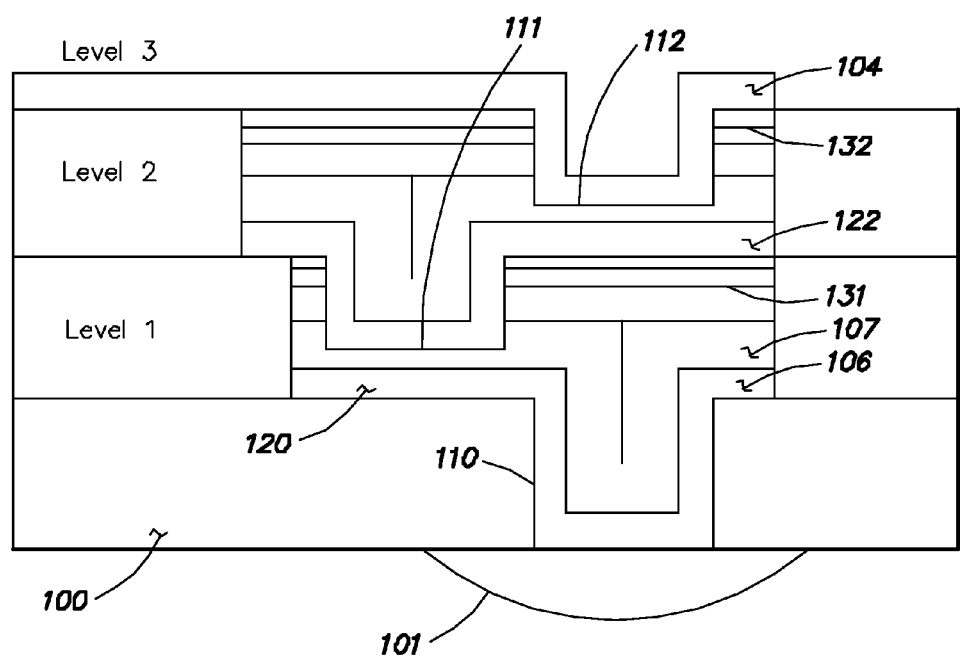
FIG. 12 is a cross-sectional elevation view of an array showing a contact between three levels of the memory array.
Figure 13B:
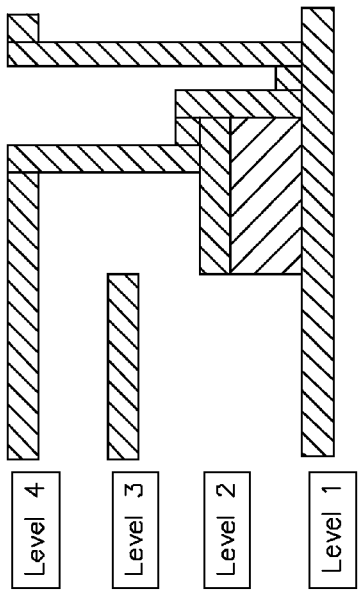
FIG. 13(b) illustrates a contact connecting levels 1, 2 and 4.
Figure 13E:
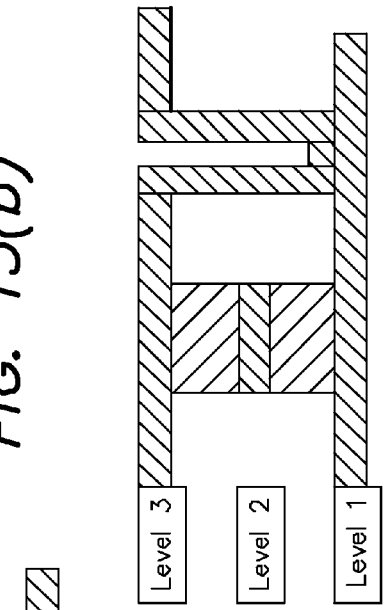
FIG. 13(e) illustrates a contact between levels 1 and 3.
Figure 13A:
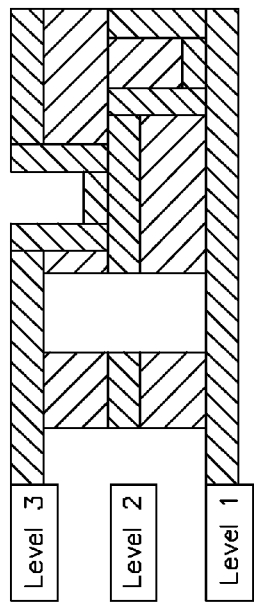
FIG. 13(a) illustrates a contact between levels 1 and 3.
Figure 13D:
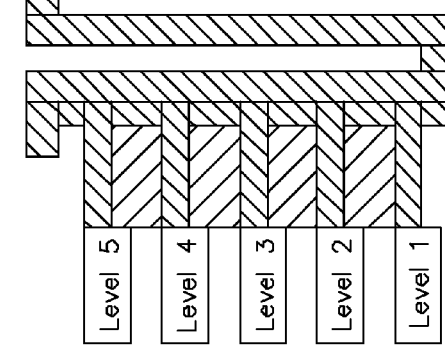
FIG. 13(d) illustrates a contact between levels 1 through 5.
Figure 13C:
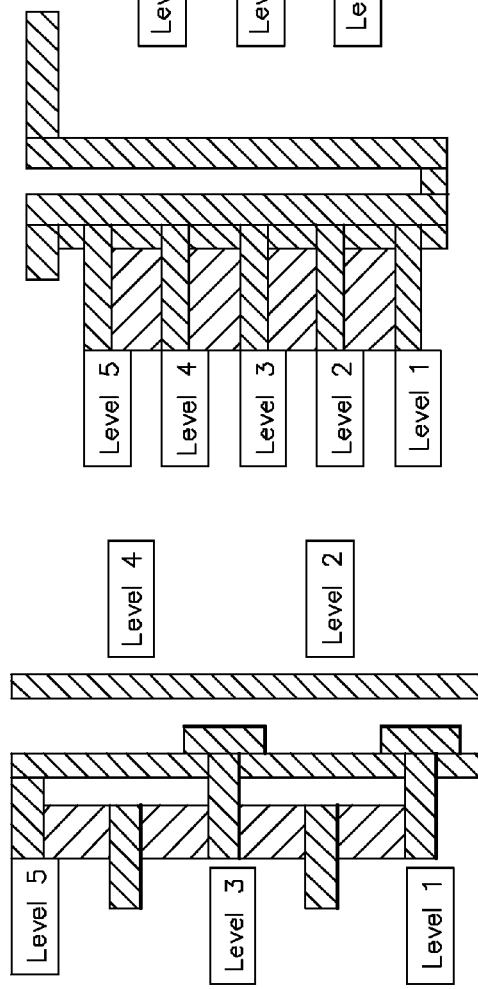
FIG. 13(c) illustrates a contact between levels 1, 3 and 5.

An example of this is shown in FIG. 12. Starting from the base of the structure a contact 110 is masked and etched through the substrate isolation 100 to the substrate contact 101 prior to beginning the fabrication of the array.

Conductor layer 106 is deposited prior to the memory stack 131. The lower level of the memory stack 107 is a heavily doped semiconductor in this example. This is important in this example because the heavily doped semiconductor will provide an ohmic connection and therefore does not need to be completely removed from the conductor layer.

Region 120 and the area over contact 110 are formed during the formation of the strips that make up level 1. In this case, 120 is electrically isolated from the other conductors on level 1 by virtue of the level 1 mask layout. Dielectric is then deposited and planarized to expose the top surface of level 1. Contact opening 111 is then formed through the layers of level 1 at least down to the heavily doped layer 107.

Level 2 conductor 122 and memory stack layers are then deposited and patterned in the same way as level one was patterned. Again, the mask is used to isolate this region from the conductors of the level 2 array. Dielectric is again deposited and etched back to expose the top surface of level 2. Just as in level 1, a contact mask is used to form opening 112 through the memory cell elements down to the heavily doped material. Finally, level 3 conductor is deposited into the opening 112 to form a continuous electrical connection from level 3 to the substrate.

From the above description, it will be apparent that contacts from any level may be made to a region in the substrate with one additional masking step per layer. In another embodiment, less than one masking step per layer is used to form the conductive paths to the substrate. This is possible in cases where more than one conductor contacts a single substrate region. Note in FIG. 13(*c*), for instance, that conductors 1, 3, and 5 are connected to the same substrate regions.

Several possible structures for contacts are shown in FIGS. 13(*a*)-13(*e*). In FIG. 13(*a*) an arrangement is shown where contact is made between conductors in level 1 (or level N) and level 3 (or level N+2). Note that in this arrangement, the conductors in level N+1 are made shorter than the conductors in level N and level N+2, to allow ample space for the contact to be made without interfering with conductors in level N+1. Here the contact, since it is between adjacent levels, extends through the memory stack shown in the crosshatching.

In FIG. 13(*b*) a contact is shown from a conductor in level 4 (or level N+3) which contacts conductors in levels 1 and 2 (or levels N and N+1). Note in this arrangement that the conductor in level N+2 is shorter than the conductor in level N, allowing the structure fabricated from level N+3 to reach down and contact two underlying conductors. Only a single opening needs to be defined in the insulator to form this contact and the opening is disposed through the oxide or other insulator used in the planarization step.

Another contact is shown in FIG. 13(*c*) where conductors from levels 1, 3 and 5 are connected to contact a substrate region. Here the conductors in levels 2 and 4 are staggered so as not to interfere with the contact. Again only a single masking step is used to define this contact.

In FIG. 13(*d*) a contact structure is shown where levels 1, 2, 3, 4 and 5 each have a conductor connected to a common substrate region.

Finally, in FIG. 13(*e*) a contact from level 3 (or level N+2) to level 1 (or level N) is shown. Here unlike FIG. 13(*a*), a single opening through insulation material is made.

In forming the structures 13(*a*)-(*e*) the resistivity of the vertical conductors is important. Metals, silicides and in-situ doped silicon can be used. Implanted silicon is not currently preferred because of the difficulty of doping the silicon on the sidewalls of the contact.

It should be noted that in forming the contact of FIG. 13(*d*) an opening is first etched from an upper layer through several lower layers. After the insulation has been etched to expose the edges of the layers, the memory cell material is then etched isotropically to expose more of the conductor. In this way, an isotropic deposition of a material like polysilicon or CVD W can be used to obtain a large surface area on each conductor to insure low contact resistance.

While the contact of FIG. 13(*c*) uses the same principal, because of the staggering of the layers only insulating material needs to be etched isotropically to expose the edges of the level 1 and 3 conductors.

The techniques shown in FIGS. 13(*d*) and 13(*c*) are used to limit the number of mask steps needed in the process. Use of either one could reduce the mask count from 2N+1 to N+2 . . . .

Memory Cell: Small Feature Sizes

As was previously discussed, self-alignment permits the pattern features of the memory cell to be small, since it is not necessary to allow for misalignment tolerances when laying out the features. These smaller features allow reduction in the memory cell area, in fact smaller than it otherwise could be without self-alignment.

But there is a second benefit of the memory cell area that permits additional reduction of the cell: the highly repetitive pattern of geometric features on each mask layer.

The geometric shapes in each layer of the invented memory cell array are especially simple: they are merely a highly repetitive, regular set of closely spaced, long, straight parallel conductor lines. Their simplicity and regularity can be exploited in photolithography, allowing better resolution of smaller feature sizes than otherwise would be possible with arbitrary-shaped geometries.

For example, if a (wafer stepper and illumination source and lens and photoresist) system were normally rated for X micron resolution (e.g., 0.18 microns), the simple and highly regular shapes of the present invention would permit lines and spaces substantially smaller than X microns.

The present invention can take advantage of the fact that there are no arbitrary-shaped geometries; rather there is a highly repetitive, very simple pattern, which is well known in the field of optics and is called a "diffraction grating" in textbooks. It will be readily apparent to those skilled in the art how to exploit the advantages of a diffraction grating pattern to achieve better resolution.

Three-Dimensional Array Organization

For a moment assume an embodiment which has six layers of memory cell pillars, and which therefore has seven conductor layers of conductors. If the bottom conductor layer (conductors1) runs east-to-west, then conductors3, conductors5, and conductors7 also run east-to-west. And conductors2, conductors4, and conductors6 run north-to-south. For simplicity, consider an embodiment in which the pillars are not offset or staggered; rather, they are stacked directly above one another. A single vertical stack of six such pillars is shown in FIG. 8(*a*).

Figure 8A:
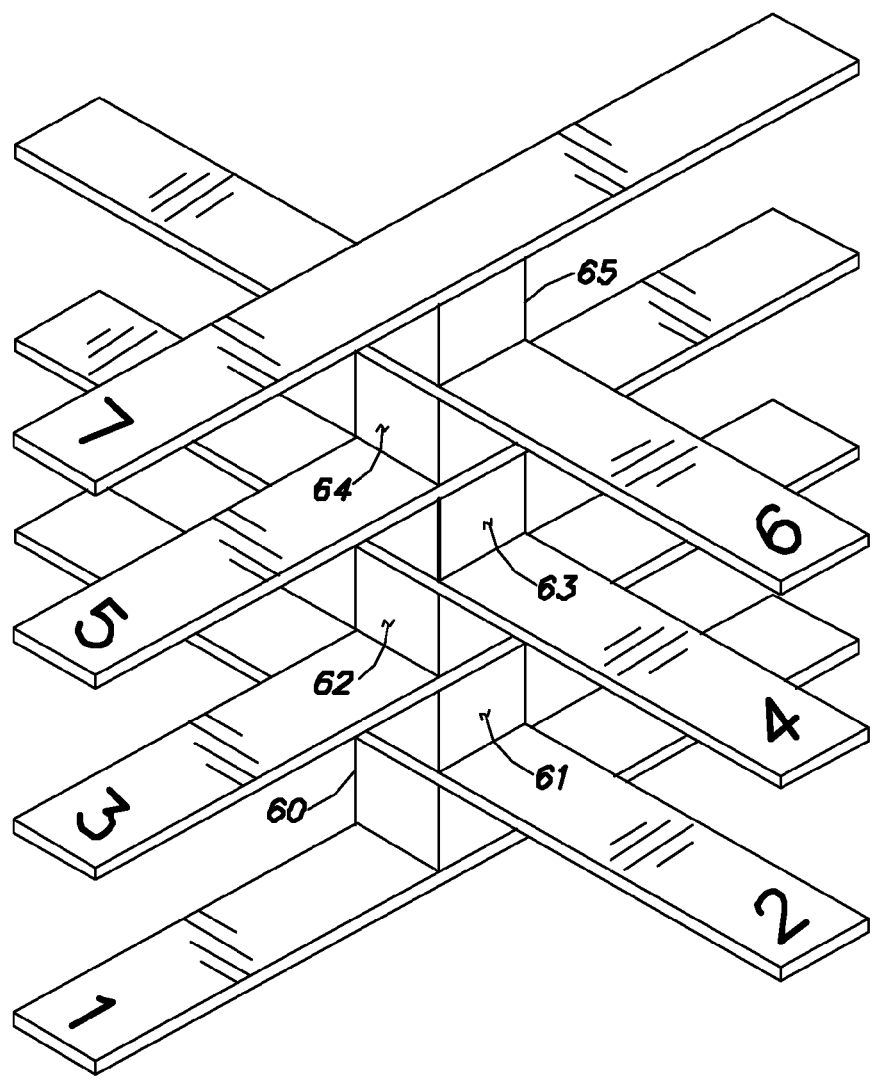
FIG. 8(a) is a perspective view of vertically stacked cells.

FIG. 8(*a*)'s stack of six memory cell pillars (60-65) is shown as a circuit schematic diagram in FIG. 8(*b*). Notice that conductor layers 1, 3, 5, 7 are spaced apart from one another in the schematic diagram, but in the physical structure (FIG. 8(*a*)) they are vertically stacked directly above one another. Similarly, conductor layers 2, 4, 6 are vertically stacked in FIG. 8(*a*) but spaced apart in FIG. 8(*b*).

There are six memory cell pillars in FIG. 8(*a*): one where conductors2 crosses conductors1, one where conductors3 crosses conductors2, . . . , and one where conductors7 crosses conductors6. In the schematic of FIG. 8(*b*) these are shown along a diagonal. At the bottom left, a memory cell (containing a steering element and a state change element) is shown between conductors2 and conductors1. FIG. 8(*b*) also shows a memory cell where conductors3 crosses conductors2, another cell where conductors4 crosses conductors3, etc.

Adjacent layers of memory cell pillars share a conductor layer; thus they also share an I/O terminal. In one embodiment, sharing only occurs between terminals of like type: input terminals share a conductor layer with other input terminals, and output terminals share a conductor layer with other output terminals.

This embodiment is advantageous, because it means each conductor layer is unambiguously either an input layer or an output layer. There is no mixing as would occur if a conductor layer was shared among input terminals and output terminals, so the peripheral circuitry is simplified. Input-terminal-driver circuits and output-terminal-receiver circuits need not be collocated and multiplexed onto the same conductor.

A result of the like-terminals-shared preference is that the steering elements in the memory cells will be oriented alternately cathode-up, then cathode-down, then cathode-up, etc. To see this, suppose conductor layer conductors2 is an output layer; then the cathodes of pillar 60 and pillar 61 both connect to conductors2. Thus pillar 60 must be oriented cathode-up and pillar 61 is cathode-down. Continuing, if conductors2 is an output layer, then conductors3 is an input layer. The anodes of pillar 61 and pillar 62 connect to conductors3. So pillar 62 is cathode-up.

The layers of pillars must alternate, cathode-up, cathode-down, up, down, up, and so forth (see FIG. 8(*b*)) for this embodiment. This means that during fabrication, the sub-layers of the pillar sandwich will be deposited in a different order. In some pillar layers the anode material sub-layer will be deposited before the cathode material sub-layer, and in the other pillar layers the cathode material sub-layer will be deposited first. Thus the layers shown in FIG. 6(*a*) will be in the order shown in alternate array levels and in the opposite order in the remaining levels. However, it should be recalled that it is not necessary to alternate the stack material for some embodiments.

A further result of the preference for sharing like terminals of memory cells is that it makes the conductor layers alternate between input terminals only and output terminals only. Since successive conductor layers run east-to-west, then north-to-south, then east-to-west, etc., this means that all input conductors will run the same direction (e.g., east-to-west), and all output conductors will run the same direction (e.g., north-to-south). So it will be especially easy to locate the input-terminal-driver circuits together (e.g., along the west edge of the memory array), and to locate the output-terminal-receiver circuits elsewhere (e.g., along the south edge of the memory array).

This corresponds to standard practice in conventional memory design: the input-terminal-driver circuitry 67 is located along the west edge of the array, and the output-terminal-receiver circuitry 68 is located along the south edge of the array, as shown in FIG. 9(*a*). Sometimes conventional memories put half the input-terminal-driver circuits along the east edge and half along the west edge; this is often done when the memory cell row pitch is very tight. Similarly, conventional memories sometimes place half the output-terminal-receiver circuits along the south edge and half along the north edge; this is done when the memory cell column pitch is very tight. FIG. 9(*b*) shows a conventional memory with this splitting performed.

It is now appropriate to note that the input-terminal-driver circuitry in a nonvolatile memory (both conventional prior art, and the present invention) has a shorter and less cumbersome name: "row address decoder" circuitry. And the output-terminal-receiver circuitry in a nonvolatile memory (both conventional prior art and the present invention) has a shorter and less cumbersome name: "column address decoder and column I/O" circuitry. In this section of the disclosure, which discusses array organization outside the memory cell mats, this shorter name will be used.

It is possible to fold the row decoder circuits and the column decoder and column I/O circuits underneath the memory array. This is possible because the memory array is above the underlying monocrystalline substrate and does not contact the substrate. Completely folding all of the row decoder circuits and all of the column circuits underneath the array is not done; such folding would overlap in the corners.

In one embodiment, the column decoder and column I/O circuits are folded beneath the memory array, but the row address decoder circuits remain outside the array. In another embodiment, the column circuits are underneath the array, and the central portion of the row decoders is folded (where there is no conflict with the column circuits) under the array.

This gives a layout with small "tabs" of row circuits at the corners, as shown in FIG. 9(*c*). These tabs can be interdigitated with the tabs of other memory arrays, letting four (or more) arrays nestle closely together, as shown in FIG. 9(*d*). Other variations on the theme of partially folding decoders under the array will be readily apparent to those skilled in the art.

As the previous paragraph alludes, the field programmable nonvolatile memory of the present invention includes the organization of the memory chip into several smaller sub-arrays, rather than one single large array. Sub-arrays give three important benefits: (1) they allow a simple block-level approach to redundancy; (2) they increase operating speed; (3) they lower operating power.

Redundancy with sub-arrays can be quite straightforward. If the end product is to be a memory having (say) 8N bits, it is a simple matter to build nine sub-arrays on the die, each containing N bits. Then one of the nine sub-arrays can be defective, yet the die can still be configured and sold as a working 8N bit memory, by simply bypassing the defective sub-array.

Dividing the memory into sub-arrays also increases speed; this is because the conductors are shorter (decreasing their resistance), and there are fewer memory cells attached to each conductor (decreasing the capacitance). Since delay is proportional to the product of resistance and capacitance, cutting conductor length in half cuts delay by a factor of four. Thus sub-arrays decrease delay, i.e., increase speed.

Sub-arrays also provide lower power operation. Since one important component of power is the capacitive charging and discharging of conductors in the memory array, decreasing the conductor capacitance will decrease power consumption. Cutting conductor length in half cuts capacitance in half, which cuts the capacitive charging and discharging current in half.

Circuit Design: Row Decoding and Section

In one embodiment of the present invention, the rows of a memory array (also called "wordlines") are the inputs of the memory cells, and the columns (also called "bitlines") are the outputs of the memory cells. A forcing function is applied to the memory cell input (wordline), and for a read the result at the memory cell's output (bitline) is sensed, while for a write another forcing function is applied to the memory cell output (thereby forcing both terminals of the cell). The forcing functions used with the present invention may be voltage sources, current sources, wave-shape generators (either high impedance or low impedance), charge packets, or other driving stimuli.

In order to unambiguously access each individual memory cell, for both reading and writing, a unique circuit path is established from the row lines, through the memory cell, to the column lines. A consequence of the uniqueness requirement is that all of the row lines cannot be driven simultaneously; this may be appreciated by considering FIG. 8(b).

Figure 8B:
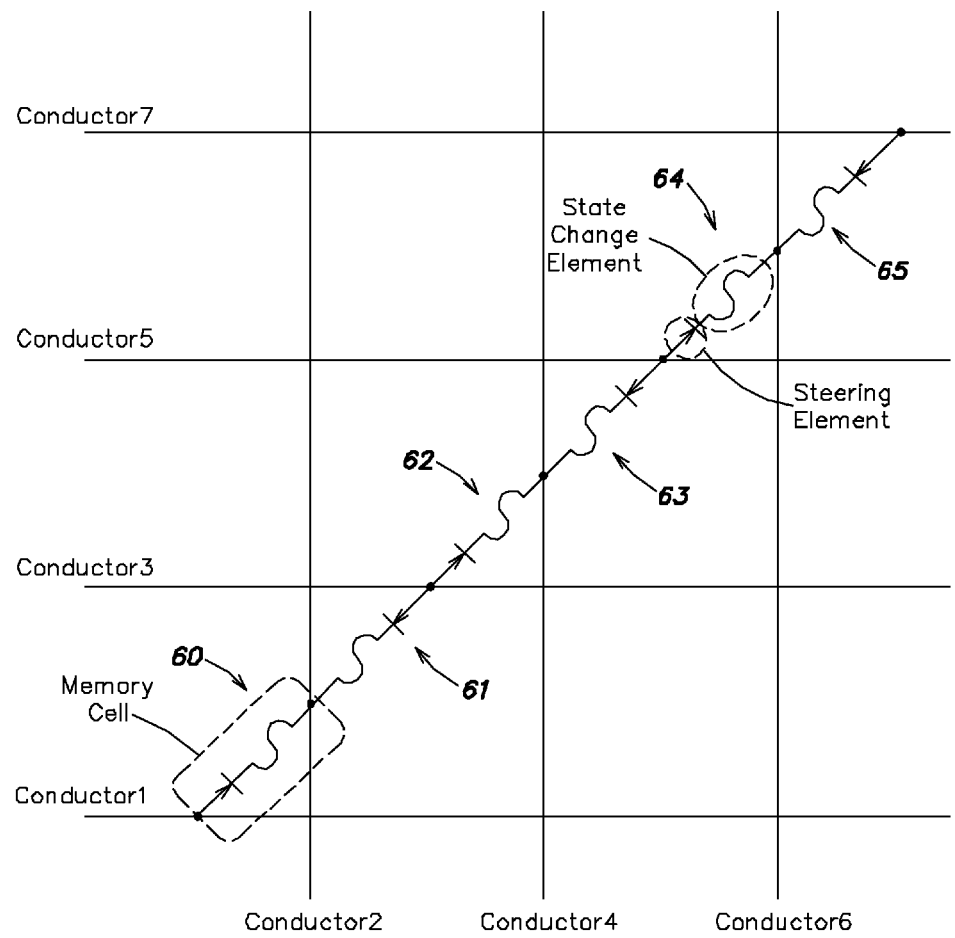
FIG. 8(b) is a schematic of the cells of FIG. 8(a).

The row lines (wordlines) in FIG. 8(b) are on conductor layers 1, 3, 5, and 7. The column lines (bitlines) are on conductor layers 2, 4, and 6. Recall that FIG. 8 represents a single vertical stack of memory cell pillars; it is the physical intersection of one single row and one single column. The drawing in FIG. 8(b) depicts the conductors spaced-apart for easier viewing, but in reality they are stacked above one another.

Suppose that all wordlines were driven simultaneously; for example, suppose conductor layers 1, 3, 5, and 7 were forced to a high voltage. There is no unambiguous circuit path to the circuit outputs (on the bitlines, namely conductor layers 2, 4, and 6), so the contents of the memory cells cannot be determined.

For example, suppose that sensing circuitry determines that conductors2 is at a high voltage; what does this mean? It means that either the memory cell between conductors1 and conductors2 is programmed to a low impedance state, or the memory cell between conductors2 and conductors3 is programmed to a low impedance state. Either of these two possibilities establishes a circuit path from a source of high voltage (the wordlines) to the bitline on conductors2. But unfortunately which of these possibilities is in fact true cannot be determined: there is not a unique circuit path to conductors2. And this is also the case for the other two bitlines, conductors4 and conductors6.

Thus all wordlines should not be driven simultaneously; this produces non-unique circuit paths to the memory array outputs. A straightforward solution is to only drive a single wordline, leaving all other wordlines un-driven. This is diagrammed in FIG. 10(a). A row decoder 70 selects whether any of the wordlines along this row should be enabled. And four layer-select signals select which conductor layer wordline should be enabled in the selected row. All but one of the layer-select signals are in the deselect condition (e.g., low voltage), and only one of the layer-select signals is in the select condition (e.g., high voltage). Thus only one wordline is driven, and the other three are not driven.

Figure 10A:
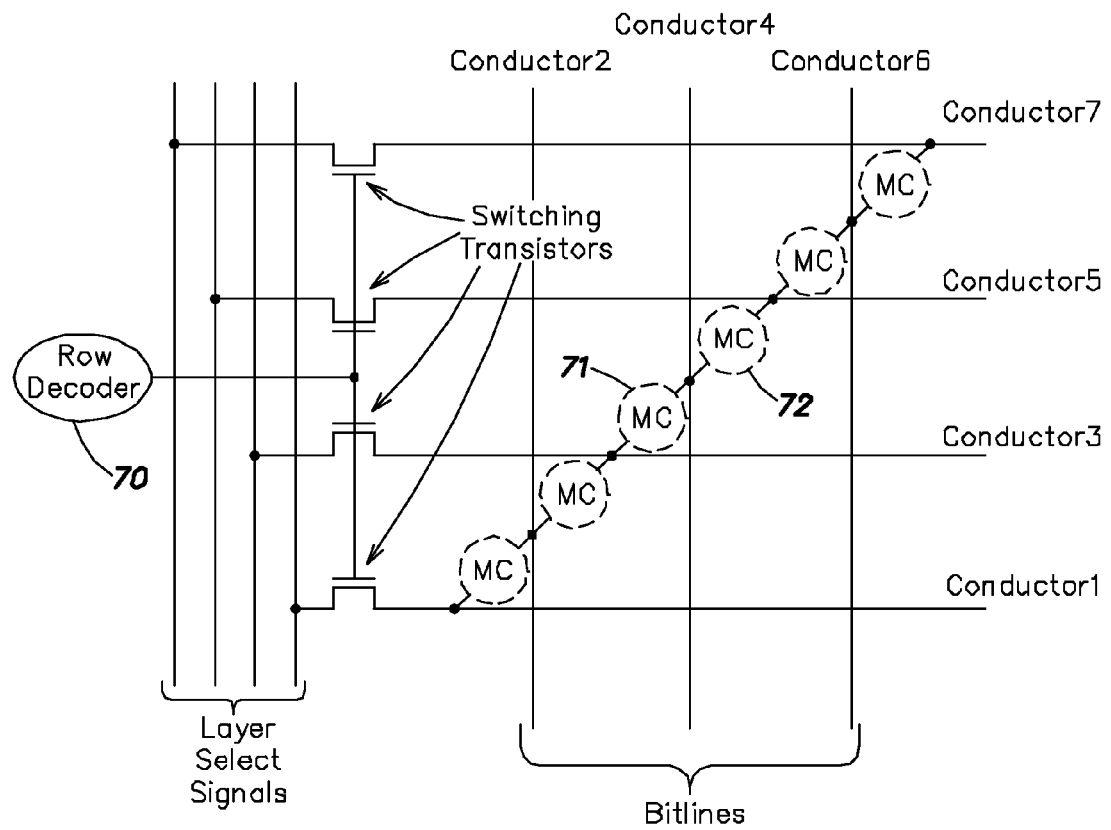
FIG. 10(a) is an electrical schematic of peripheral circuitry coupled to an array.

Clearly the arrangement in FIG. 10(a) establishes a unique path to the array outputs. Suppose the wordline on conductors5 is selected, and suppose that sensing circuitry determines that conductors4 is at a high voltage. There are only two ways for conductors4 to go high: one is through the memory cell 71 between conductors3 and conductors4, and the other is through the memory cell 72 between conductors4 and conductors5. Since conductors5 is driven and conductors3 is not driven, the only circuit path that exists is from the wordline on conductors5, through the memory cell 72 between conductors5 and conductors4, and out the bitline on conductors4. If conductors4 is sensed to be a high voltage, then this memory cell is programmed to be a logic-zero; otherwise this memory cell is a logic-one.

But the arrangement in FIG. 10(a) is costly; it includes a switching transistor for each of the wordline layers in the memory array. If there are a large number of vertical layers in the array (e.g., sixteen layers of memory pillars, requiring nine wordline conductor layers and eight bitline conductor layers), the switching transistors consume a lot of silicon area. This degrades die efficiency, which drives cost up and density down.

However, we observe that the ambiguity in FIG. 8(b) arises because there are two paths to each bitline: one from the wordline on the conductor layer immediately below, and one from the wordline on the conductor layer immediately above. To avoid ambiguity, all we must do is guarantee that only one of the two possible paths is enabled.

This is easily accomplished by partitioning the wordlines into sets: the "first set" and the "second set." Wordlines on conductor layers conductors1, conductors5, conductors9, conductors13, conductors17, . . . , etc., are in the first set, and wordlines on conductor layers conductors3, conductors7, conductors11, conductors15, . . . , etc., are in the second set. The key observation is that it is perfectly safe to simultaneously drive all of the wordlines in the first set, as long as no other of the wordlines in the second set is driven, and vice versa (FIG. 10(b)).

Figure 10B:
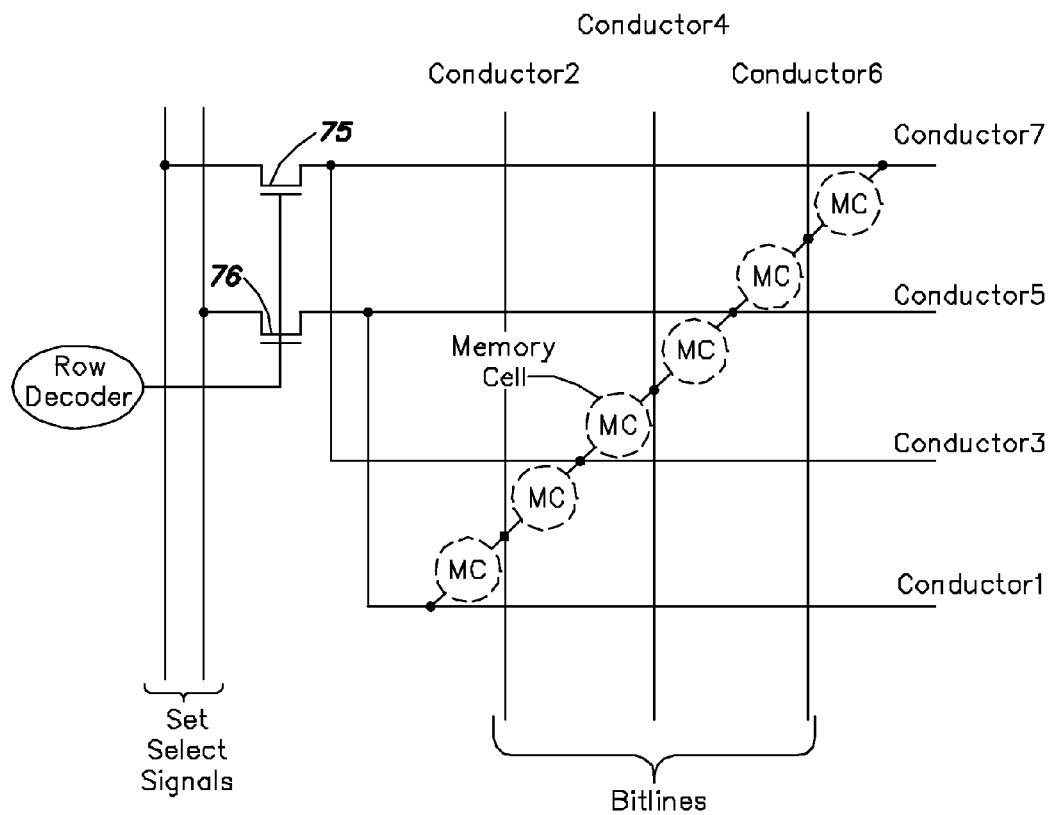
FIG. 10(b) is another electrical schematic of peripheral circuitry coupled to an array.

The circuit in FIG. 10(b) only includes two switching transistors 75 and 76, regardless of the number of vertical layers of memory cells in the array. There is one switching transistor for the first set of wordlines, and one switching transistor for the second set. Similarly there are two set-select signals, that determine which of the two wordline sets are driven. The greater the number of vertical layers of memory cells in the chip, the greater are the savings of FIG. 10(b) compared to FIG. 10(a).

Suppose the first set-select signal is in the select condition (high voltage) and the second set-select signal is in the deselect condition. Then the wordlines on layers conductors1, conductors5, conductors9, . . . , etc are driven, while the wordlines on layers conductors3, conductors7, conductors11, . . . are not driven. There is only one (unique) path to the bitline on conductor2: this is the path from conductors1, through the memory cell between conductors1 and conductor2, and onto the bitline on the conductor2 layer. The other possible path, from conductors3, through the memory cell between conductors3 and conductor2, and onto conductors2, is disabled because conductors3 is in the second wordline set and is not driven.

Circuit Design: Column Decoding and Selection

A consequence of the two-sets-of-wordlines organization (FIG. 10(b)) is that every bitline will have a memory cell row-selected onto it. Thus, if there are (N) conductor layers devoted to bitlines, each selected column could read or write (N) bits of memory simultaneously. One embodiment of the present invention does indeed read (and/or write) N bits at once, in each selected column. Other embodiments introduce column multiplexor circuitry, which reduces the number of simultaneously accessed memory cells.

Figure 11:
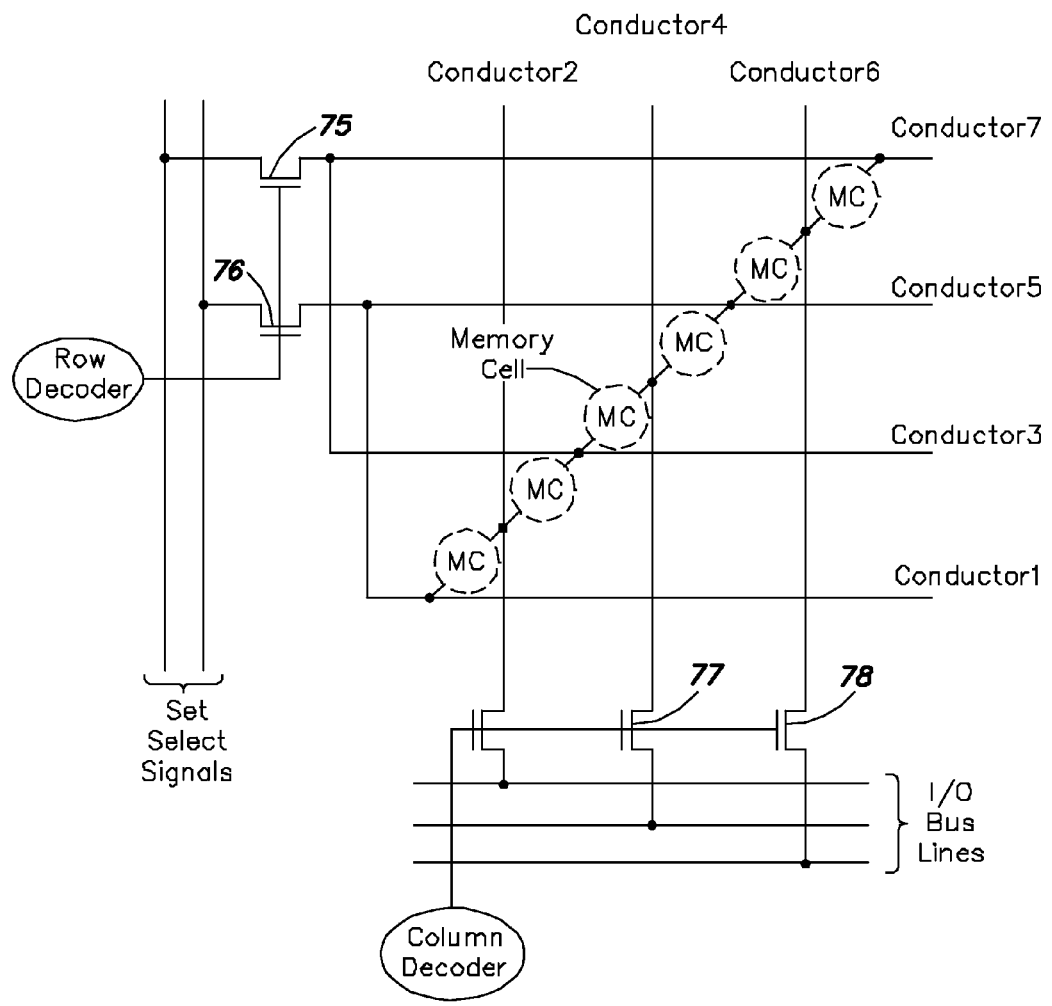
FIG. 11 is an electrical schematic of peripheral circuitry coupled to an array used in one preferred embodiment of the present invention.

FIG. 11 shows another embodiment. Each bitline is provided with its own switching transistor such as transistors 77 and 78; these transistors connect a bitline to a bidirectional I/O bus if this column is selected. During read operations, the bitline drives the I/O bus, but during write operations, the I/O bus drives the bitline. If there are (N) layers of bitlines, there are (N) switching transistors and (N) I/O bus conductors. The I/O bus conductor connects to peripheral circuits, including a sense amplifier (for reads) and a write driver (for writes).

This column selection circuitry is far more costly than the row selection circuits shown in FIG. 10(b). Since there must be a switching transistor for every bitline, if more and more layers of memory cells are stacked vertically, there will be more and more bitlines, hence more and more switching transistors.

Figure 9A:
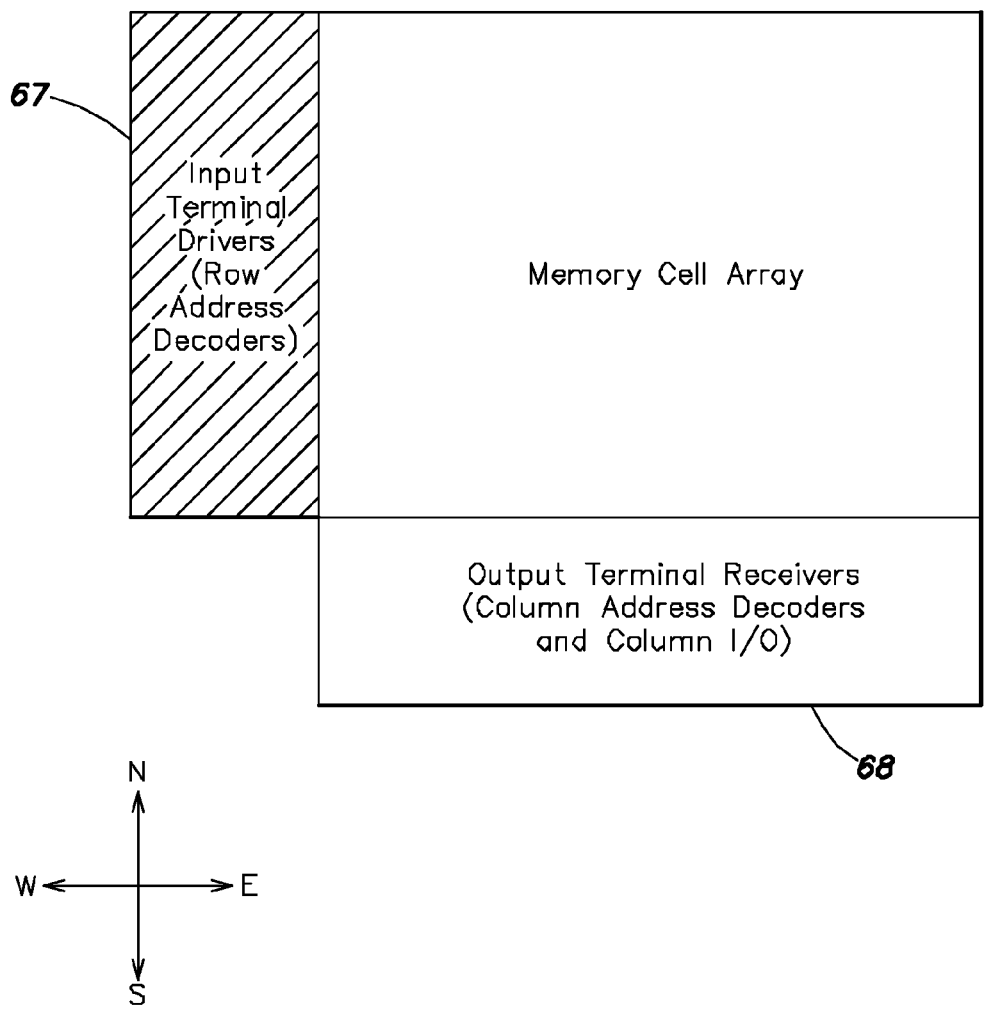
FIG. 9(a) is a plan view of a substrate showing a layout of circuitry in the substrate.
Figure 9B:
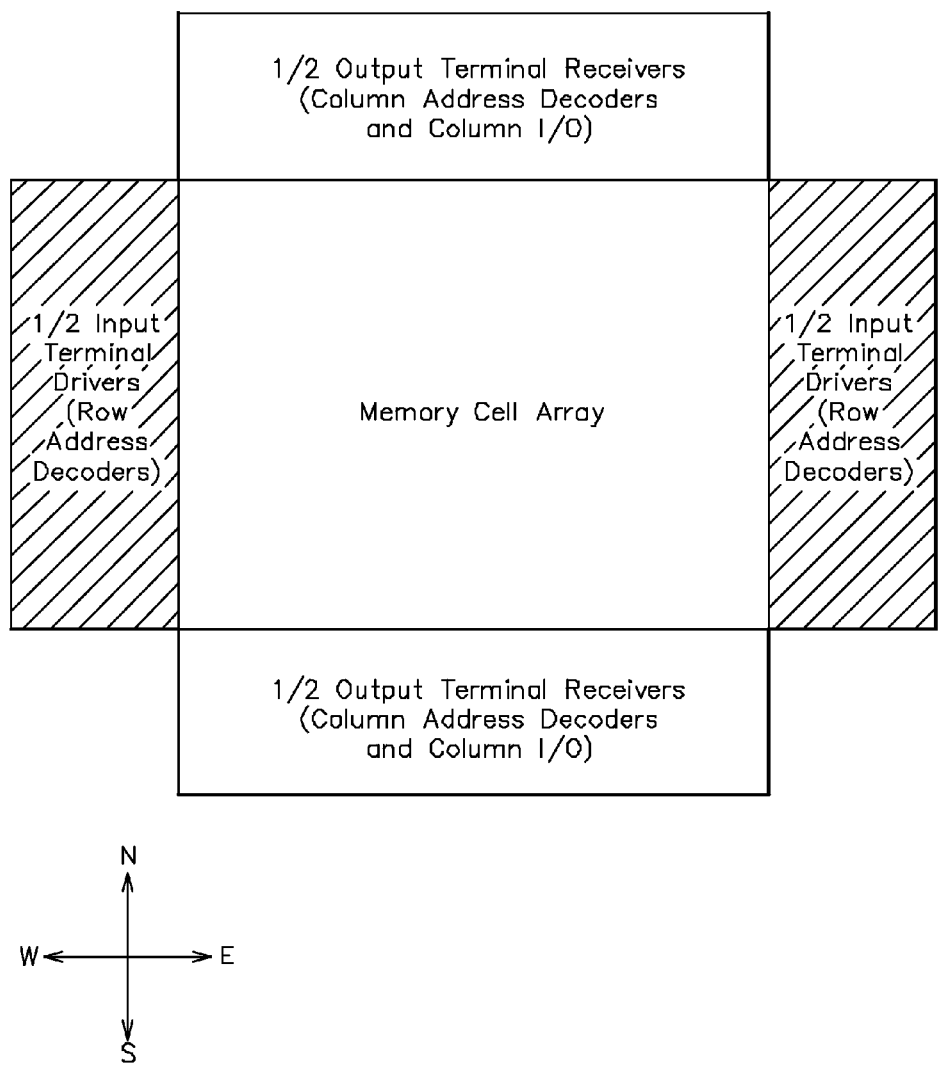
FIG. 9(b) is a plan view of a substrate showing another layout of circuitry in the substrate.
Figure 9C:
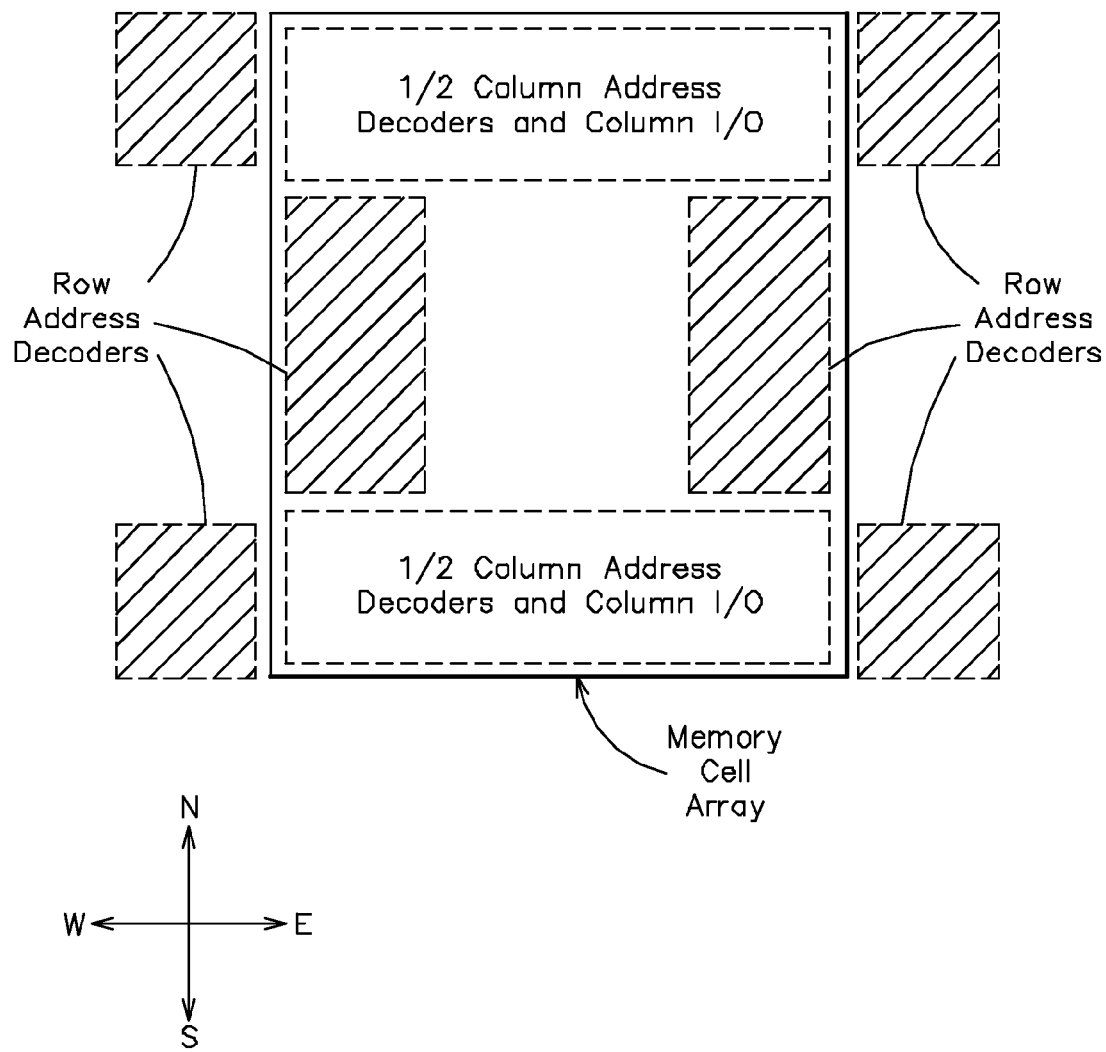
FIG. 9(c) is a plan view of a substrate showing one layout of circuitry in a substrate used for the present invention.
Figure 9D:
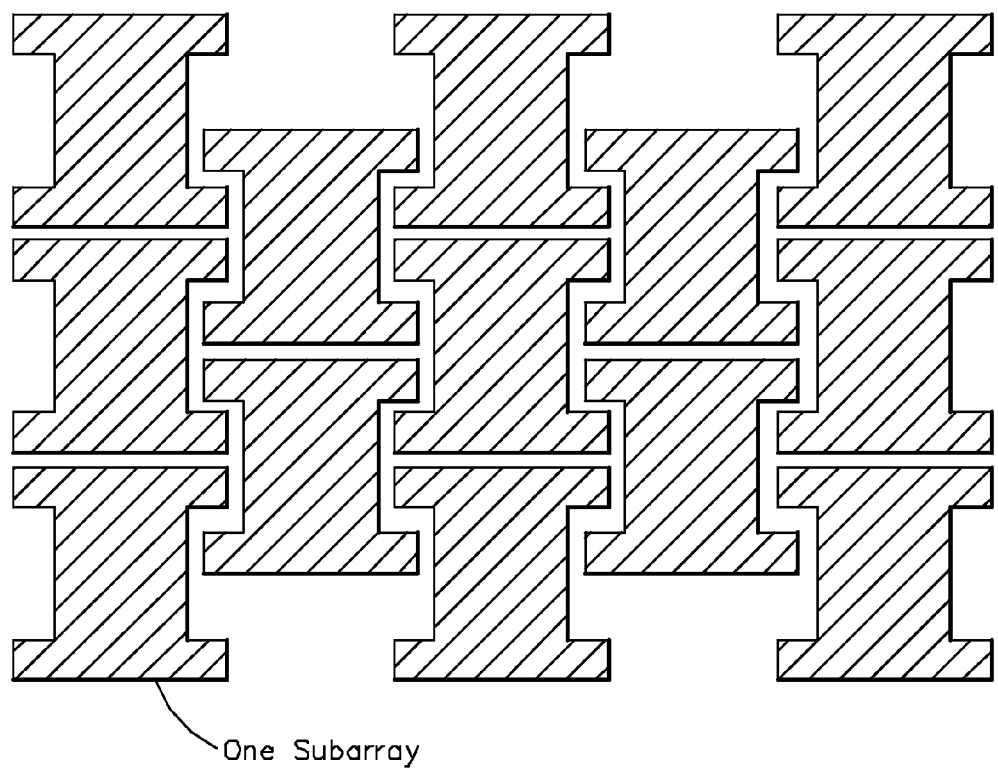
FIG. 9(d) is a plan view of circuitry for an embodiment of the present invention using a plurality of sub-arrays.

Thus the column selection circuitry will consume more silicon area than the row selection circuitry, especially when there are a large number of vertically stacked layers of memory cells. This is why it is preferred to fold the column select circuits under the memory array, more so than the row select circuits, as shown in FIG. 9(c): the column circuits are a lot bigger. In fact, it would be a reasonable design decision to fold the column circuits underneath the memory array and completely forget even trying to fold the row select circuits beneath. The advantage comes from folding the column selects.

Precharging the Memory Array

In many cases it is appropriate to "pre-charge" all wordlines to an intermediate level such as 0.5 times the supply voltage, and to "pre-charge" all bitlines to an intermediate voltage level such as 0.4 times the supply voltage before commencing a read or write operation.

Circuit Design: Read/Write Peripheral Circuits

Several embodiments of the present invention use a state change element whose different states correspond to different values of impedance. For example, a dielectric rupture antifuse has two states: very low impedance and very high impedance, in which the impedances differ by several orders of magnitude. Embodiments such as these can use a "current-mode read" and a "voltage-mode or current-mode write," as explained below.

When reading such a memory cell, a current source can be selected as the forcing function which drives the wordlines. If the memory cell is programmed (dielectric ruptured, thus low impedance), this driving current will pass through the memory cell and onto the bitline. The selected bitline will be switched onto the (bidirectional) I/O line, and the driving current will be passed onto the I/O line. A current-sensing amplifier connected to the I/O line detects whether or not the driving current is passed onto the I/O line. If so, the cell being read contains a "logic one" and if not, the cell contains a "logic zero."

The main advantage of a current-mode read is speed: by forcing and sensing current (rather than voltage), the need to charge and discharge the high-capacitance wordlines and bitlines in the memory array is avoided, so the wordlines and bitlines do not swing through large voltage excursions, which speeds up the read operation. Therefore current-mode reads are preferred in many embodiments of the present invention.

In one embodiment of writing the memory cell, a voltage source can be selected as the forcing function which drives the wordlines. Additionally, the bidirectional I/O bus can be driven with another voltage source. The I/O bus will be connected to the bitline (by the column select switching transistor) in the selected column, so the selected memory cell (at the intersection of the selected wordline and the selected bitline) will be driven by two voltage sources: one on the wordline, the other on the I/O bus. The large voltage difference between these two sources will be impressed directly across the selected memory cell, achieving a voltage-mode (large voltage excursion on the wordlines and bitlines) write.

Although voltage-mode writing is slower, since it must charge and discharge the high capacitance wordlines and bitlines, it is nevertheless preferable in some embodiments of the present invention. Voltage-mode writing can, if necessary, provide very high current through the memory cell, which is advantageous with several embodiments of the state change element such as an amorphous-semiconductor antifuse.

In some embodiments of voltage-mode writing, it may be preferable to limit the maximum current to a particular value. One possible benefit of limiting the maximum current is to reduce the effect of IR voltage drops along the conductors of the array to ensure that a consistent programming energy is delivered to each memory cell, independent of the cell's location in the array. A consistent programming energy can be important because the characteristics of some state-change element materials may be sensitive to programming energy.

In some embodiments, the voltage necessary to program the state change element, may exceed the voltage capabilities of the peripheral transistors. This is particularly true when the transistors are scaled for small dimensions (for example, channel length below 0.2 microns). In these cases the peripheral circuits may be arranged so that during a write cycle, the row decoders operate from a power supply of +V volts, while the column decoders and column I/O circuits and write data drivers operate from a power supply of −V volts. This arrangement puts a voltage difference of 2×V volts across the memory cell being written ((+V)−(−V)=2×V), while placing at most V volts across any one transistor.

Thus, a vertically stacked nonvolatile memory has been disclosed that permits the fabrication of extremely high density array.

The invention claimed is:

1. A memory cell comprising:
a steering element; and
a non-volatile state change element coupled in series with the steering element,
wherein the steering element and state change element are disposed in a vertically-oriented pillar.

2. The memory cell of claim 1, wherein the steering element comprises a p-n diode.

3. The memory cell of claim 1, wherein the steering element comprises a p-i-n diode.

4. The memory cell of claim 1, wherein the steering element comprises a Schottky diode.

5. The memory cell of claim 1, wherein the state change element comprises a reversible resistance-switching element.

6. The memory cell of claim 1, wherein the state change element is capable of having a high impedance state, and a low-impedance state.

7. The memory cell of claim 1, wherein the state change element is capable of having more than two resistance states.

8. The memory cell of claim 1, wherein the state change element is rewriteable.

9. A memory array comprising a plurality of the memory cells of claim 1.

10. A three-dimensional memory array including:
a first memory level comprising a first plurality of the memory cells of claim 1; and
a second memory level disposed vertically above the first memory level, the second memory level comprising a second plurality of the memory cells of claim 1.

11. A method of forming a memory cell, the method comprising:
 forming a steering element; and
 forming a non-volatile state change element in series with the steering element,
 wherein the steering element and state change element are disposed in a vertically-oriented pillar.

12. The method of claim 11, wherein the steering element comprises a p-n diode.

13. The method of claim 11, wherein the steering element comprises a p-i-n diode.

14. The method of claim 11, wherein the steering element comprises a Schottky diode.

15. The method of claim 11, wherein the state change element comprises a reversible resistance-switching element.

16. The method of claim 11, wherein the state change element is capable of having a high impedance state, and a low-impedance state.

17. The method of claim 11, wherein the state change element is capable of having more than two resistance states.

18. The method of claim 11, wherein the state change element is rewriteable.

19. A method of forming a memory array, the method comprising forming a plurality of the memory cells according to the method of claim 11.

20. A method of forming a three-dimensional memory array, the method comprising:
 forming a first memory level comprising a first plurality of the memory cells formed according to the method of claim 11; and
 forming a second memory level vertically above the first memory level, the second memory level comprising a second plurality of the memory cells formed according to the method of claim 11.

\* \* \* \* \*